US011036128B2

(12) United States Patent
Brouns et al.

(10) Patent No.: US 11,036,128 B2
(45) Date of Patent: *Jun. 15, 2021

(54) MEMBRANE ASSEMBLY

(71) Applicant: ASML NETHERLANDS B.V., Veldhoven (NL)

(72) Inventors: Derk Servatius Gertruda Brouns, Herentals (BE); Paul Janssen, Eindhoven (NL); Mohammad Reza Kamali, Eindhoven (NL); Mária Péter, Eindhoven (NL); Willem Joan Van Der Zande, Bussum (NL); Pieter-Jan Van Zwol, Eindhoven (NL); David Ferdinand Vles, Eindhoven (NL); Willem-Pieter Voorthuijzen, 's-Hertogenbosch (NL)

(73) Assignee: ASML NETHERLANDS B.V., Veldhoven (NL)

(*) Notice: Subject to any disclaimer, the term of this patent is extended or adjusted under 35 U.S.C. 154(b) by 182 days.

This patent is subject to a terminal disclaimer.

(21) Appl. No.: 16/060,837

(22) PCT Filed: Dec. 2, 2016

(86) PCT No.: PCT/EP2016/079584
§ 371 (c)(1),
(2) Date: Jun. 8, 2018

(87) PCT Pub. No.: WO2017/102378
PCT Pub. Date: Jun. 22, 2017

(65) Prior Publication Data
US 2018/0373141 A1   Dec. 27, 2018

(30) Foreign Application Priority Data
Apr. 6, 2016 (EP) .................................. 16163962

(51) Int. Cl.
| G03F 1/64 | (2012.01) |
| G03F 1/66 | (2012.01) |
| G03F 7/20 | (2006.01) |

(52) U.S. Cl.
CPC .................. G03F 1/64 (2013.01); G03F 1/66 (2013.01); G03F 7/70033 (2013.01);
(Continued)

(58) Field of Classification Search
CPC .......... G03F 1/64; G03F 1/66; G03F 7/70983; G03F 7/70741
See application file for complete search history.

(56) References Cited

U.S. PATENT DOCUMENTS 6,192,100 B1   2/2001 Acosta et al.
6,197,454 B1   3/2001 Yan
(Continued)

FOREIGN PATENT DOCUMENTS

| EP | 2 201 426 | 6/2010 |
| EP | 2 796 925 | 10/2014 |

(Continued)

OTHER PUBLICATIONS

Search Report and Written Opinion issued for corresponding Netherlands Patent Application No. 2020094, dated Jun. 27, 2018.
(Continued)

*Primary Examiner* — Daborah Chacko-Davis
(74) *Attorney, Agent, or Firm* — Pillsbury Winthrop Shaw Pittman, LLP

(57) ABSTRACT

A membrane assembly for EUV lithography, the membrane assembly including: a planar membrane; a border configured to hold the membrane; and a frame assembly connected to the border and configured to attach to a patterning device for EUV lithography, wherein the frame assembly is connected to the border in a direction perpendicular to the plane of the
(Continued)

membrane such that in use the frame assembly is between the border and the patterning device.

20 Claims, 8 Drawing Sheets

(52) U.S. Cl.
CPC ...... *G03F 7/70741* (2013.01); *G03F 7/70983* (2013.01); *G03F 7/70725* (2013.01); *G03F 7/70775* (2013.01)

(56) References Cited

U.S. PATENT DOCUMENTS

| | | | |
|---|---|---|---|
| 6,239,863 B1 | 5/2001 | Catey et al. | |
| 6,492,067 B1 | 12/2002 | Klebanoff et al. | |
| 7,105,047 B2 | 9/2006 | Simmons et al. | |
| 10,228,615 B2 | 3/2019 | Nikipelov et al. | |
| 10,539,886 B2* | 1/2020 | Van Der Meulen | G03F 1/22 |
| 10,558,129 B2* | 2/2020 | Kruizinga | G03F 1/64 |
| 2002/0192579 A1 | 12/2002 | Kamono | |
| 2003/0020894 A1 | 1/2003 | Wang | |
| 2005/0040345 A1 | 2/2005 | Bakker et al. | |
| 2010/0007869 A1 | 1/2010 | Xu et al. | |
| 2012/0140199 A1 | 6/2012 | Hotzel | |
| 2013/0065160 A1 | 3/2013 | Lao | |
| 2013/0250260 A1 | 9/2013 | Singh | |
| 2014/0187027 A1 | 7/2014 | Xu et al. | |
| 2014/0230694 A1 | 8/2014 | Klamklang et al. | |
| 2015/0192861 A1 | 7/2015 | Banine et al. | |
| 2015/0212433 A1 | 7/2015 | Kim | |
| 2015/0309405 A1 | 10/2015 | Shih et al. | |
| 2016/0033860 A1 | 2/2016 | Wiley et al. | |
| 2020/0012204 A1* | 1/2020 | Van Der Meulen | G03F 7/70825 |
| 2020/0057394 A1* | 2/2020 | Kruizinga | G03F 1/64 |

FOREIGN PATENT DOCUMENTS

| | | |
|---|---|---|
| EP | 2786859 | 10/2014 |
| EP | 2786860 | 10/2014 |
| JP | 61-145936 | 9/1986 |
| JP | H05231411 | 9/1993 |
| JP | H06284917 | 10/1994 |
| JP | H07113378 | 12/1995 |
| JP | H10-198022 | 7/1998 |
| JP | 11-202476 A | 7/1999 |
| JP | 2004071291 | 3/2004 |
| JP | 2005116334 | 4/2005 |
| JP | 2006-119477 A | 5/2006 |
| JP | 2008-210951 A | 9/2008 |
| JP | 2011-139102 A | 7/2011 |
| JP | 2012-022129 A | 2/2012 |
| JP | 2013-033813 | 2/2013 |
| JP | 2014-098913 | 5/2014 |
| JP | 2014523996 | 9/2014 |
| JP | 2014-228868 A | 12/2014 |
| KR | 10-2015-0053684 | 5/2015 |
| TW | 201105555 | 2/2011 |
| WO | 2013/003457 | 1/2013 |
| WO | 2013/152921 | 10/2013 |
| WO | 2014/020003 | 2/2014 |
| WO | 2014/130610 | 8/2014 |
| WO | 2014/154452 | 10/2014 |
| WO | 2016/001351 | 1/2016 |
| WO | 2017/012846 | 1/2017 |
| WO | 2017/102379 | 6/2017 |

OTHER PUBLICATIONS

Akiyama, et al., "Development of EUV Pellicle with Single Crystal Silicon Membrane," Shin-Etsu Chemical Co., Ltd., Advanced Functional Materials Research Center, 2010 International EUVL Symposium Kobe, Japan, Oct. 20, 2010, pp. 1-20.
International Search Report and Written Opinion issued for International Patent Application No. PCT/EP2016/079584, dated Apr. 28, 2017.
Unknown, "Research Disclosure," Mason Publications, Hampshire, GB, vol. 620, No. 27, Dec. 1, 2015, 12 pgs.
Search Report issued for Netherlands Patent Application No. 139768, dated Aug. 14, 2017.
Office Action issued for ROC (Taiwan) Patent Application No. 103110765, dated May 24, 2017.
Office Action dated Apr. 2, 2020 issued in corresponding U.S. Appl. No. 16/060,635.
Office Action dated Oct. 8, 2020 issued in corresponding Japanese Patent Application No. 2018-529178 with English translation.
Office Action dated Oct. 12, 2020 issued in corresponding Taiwanese Patent Application No. 105141172 with English translation (6 pgs.).
Office Action dated Dec. 24, 2020, issued in corresponding U.S. Appl. No. 16/060,635.
Japanese Office Action issued in corresponding Japanese Patent Application No. 2018-529178, dated Apr. 8, 2021.

* cited by examiner

MEMBRANE ASSEMBLY

CROSS-REFERENCE TO RELATED APPLICATIONS

This application is the U.S. national phase entry of PCT patent application no. PCT/EP2016/079584, which was filed on Dec. 2, 2016, which claims the benefit of priority of European patent application no. 15199845.7, which was filed on Dec. 14, 2015, and of European patent application no. 16157967.7, which was filed on Mar. 1, 2016, and European patent application no. 16163962.0, which was filed on Apr. 6, 2016, each of which is incorporated herein in its entirety by reference.

FIELD

The present invention relates to a membrane assembly and a patterning device assembly for EUV lithography.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \lambda / NA \quad (1)$$

where $\lambda$ is the wavelength of the radiation used, NA is the numerical aperture of the projection system used to print the pattern, k1 is a process-dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of k1.

In order to shorten the exposure wavelength and, thus, reduce the minimum printable size, it has been proposed to use an extreme ultraviolet (EUV) radiation source. EUV radiation is electromagnetic radiation having a wavelength within the range of 10-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

A lithographic apparatus includes a patterning device (e.g., a mask or a reticle). Radiation is provided through or reflected off the patterning device to form an image on a substrate. A membrane assembly may be provided to protect the patterning device from airborne particles and other forms of contamination. The membrane assembly for protecting the patterning device may be called a pellicle. Contamination on the surface of the patterning device can cause manufacturing defects on the substrate. The membrane assembly may comprise a border and a membrane stretched across the border.

In use the membrane is required to be fixed relative to the patterning device by mounting features, for example. It is desirable to reduce the amount of space taken up by the mounting features. It is also desirable for the membrane assembly to take up less space while it is being transported into position for mounting to the patterning device. It is also desirable to reduce the possibility of contaminant particles reaching a region between the membrane and the patterning device.

SUMMARY OF THE INVENTION

According to an aspect of the invention, there is provided a membrane assembly for EUV lithography, the membrane assembly comprising: a planar membrane; a border configured to hold the membrane; and a frame assembly connected to the border and configured to releasably attach to a patterning device for EUV lithography, wherein the frame assembly comprises a resilient member; wherein the frame assembly is connected to the border in a direction perpendicular to the plane of the membrane such that in use the frame assembly is between the border and the patterning device.

According to an aspect of the invention, there is provided a patterning device assembly for EUV lithography, the patterning device assembly comprising: a planar patterning device; at least one protrusion protruding from the patterning device; and the membrane assembly of any preceding claim, the frame assembly being connected to the patterning device via the at least one protrusion; wherein the at least one protrusion is between the border and the patterning device.

According to an aspect of the invention, there is provided a membrane assembly for EUV lithography, the membrane assembly comprising: a planar membrane; and a frame assembly configured to hold the membrane and to attach to a patterning device for EUV lithography; wherein the frame assembly has a locked state in which the frame assembly is locked to the patterning device such that the membrane is held a predetermined distance from the patterning device, and an unlocked state in which the membrane is less than the predetermined distance from the patterning device.

According to an aspect of the invention, there is provided a patterning device assembly for EUV lithography, the patterning device assembly comprising: a planar patterning device for EUV lithography; a membrane assembly comprising: a planar membrane; and a frame assembly configured to hold the membrane and to attach to the patterning device, wherein a gap is formed between opposing surfaces of the frame assembly and the patterning device; wherein the frame assembly comprises an elongate baffle configured to restrain contaminant particles from entering the gap, wherein the elongate baffle extends beyond the opposing surface of the patterning device at a location beyond the planar extent of the patterning device.

According to an aspect of the invention, there is provided a patterning device assembly for EUV lithography, the patterning device assembly comprising: a planar patterning device; a membrane assembly comprising a planar membrane and a border configured to hold the membrane; at least one protrusion protruding from one of the patterning device and the border, wherein the at least one protrusion is between the border and the patterning device; and a frame assembly connected to the other of the patterning device and the border, wherein the frame assembly is configured to attach to the at least one protrusion between the border and the patterning device.

According to an aspect of the invention, there is provided a loading apparatus for temporarily housing a membrane assembly that is mounted onto a patterning device for EUV lithography, the loading apparatus comprising protrusions at an inner surface of the loading apparatus, wherein the protrusions are configured to press a membrane holder of the membrane assembly towards the patterning device when the loading apparatus houses the membrane assembly.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
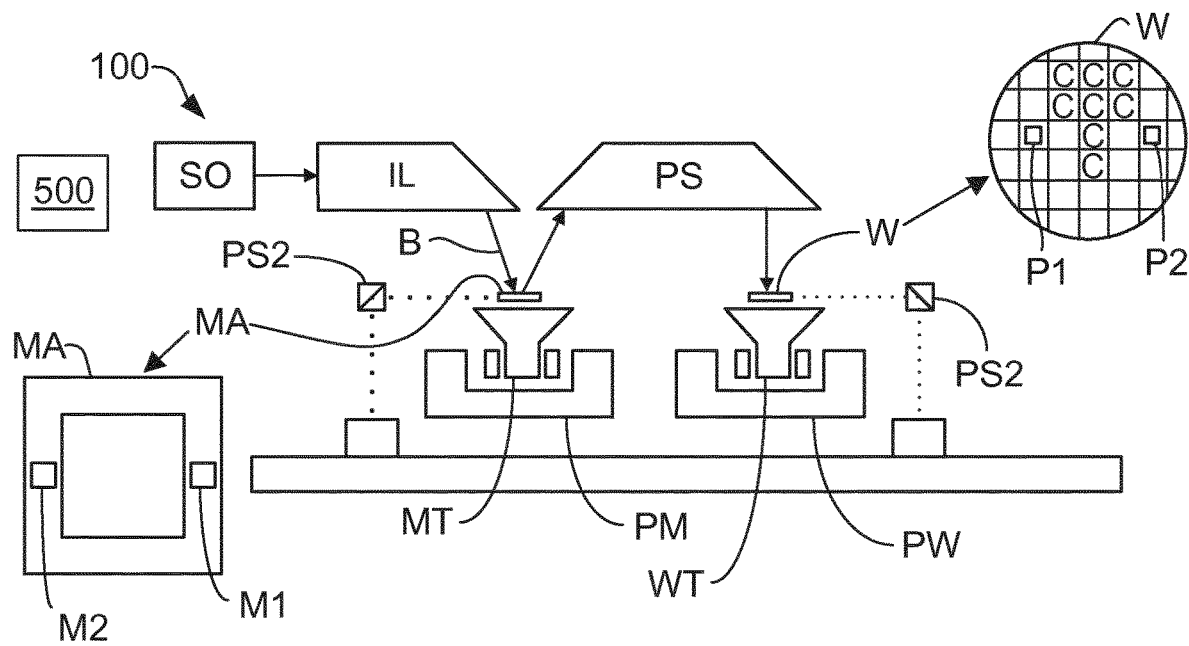
FIG. 1 depicts a lithographic apparatus according to an embodiment of the invention.

FIG. 1 schematically depicts a lithographic apparatus 100 including a source collector module SO according to one embodiment of the invention. The apparatus 100 comprises:

an illumination system (or illuminator) IL configured to condition a radiation beam B (e.g., EUV radiation).

a support structure (e.g., a mask table) MT constructed to support a patterning device (e.g., a mask or a reticle) MA and connected to a first positioner PM configured to accurately position the patterning device;

a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" should be broadly interpreted as referring to any device that can be used to impart a radiation beam B with a pattern in its cross-section such as to create a pattern in a target portion C of the substrate W. The pattern imparted to the radiation beam B may correspond to a particular functional layer in a device being created in the target portion C, such as an integrated circuit.

The patterning device MA may be transmissive or reflective. Examples of patterning devices include masks, programmable mirror arrays, and programmable liquid-crystal display (LCD) panels. Masks are well known in lithography, and include mask types such as binary, alternating phase-shift, and attenuated phase-shift, as well as various hybrid mask types. An example of a programmable minor array employs a matrix arrangement of small mirrors, each of which can be individually tilted so as to reflect an incoming radiation beam in different directions. The tilted mirrors impart a pattern in a radiation beam, which is reflected by the mirror matrix.

The projection system PS, like the illumination system IL, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the lithographic apparatus 100 is of a reflective type (e.g., employing a reflective mask).

The lithographic apparatus 100 may be of a type having two (dual stage) or more substrate tables WT (and/or two or more support structures MT). In such a "multiple stage" lithographic apparatus the additional substrate tables WT (and/or the additional support structures MT) may be used in parallel, or preparatory steps may be carried out on one or more substrate tables WT (and/or one or more support structures MT) while one or more other substrate tables WT (and/or one or more other support structures MT) are being used for exposure.

Referring to FIG. 1, the illumination system IL receives an extreme ultraviolet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module SO may be separate entities, for example when a $CO_2$ laser is used to provide the laser beam for fuel excitation.

In such cases, the laser is not considered to form part of the lithographic apparatus 100 and the radiation beam B is passed from the laser to the source collector module SO with the aid of a beam delivery system comprising, for example, suitable directing mirrors and/or a beam expander. In other cases the source may be an integral part of the source collector module SO, for example when the source is a discharge produced plasma EUV generator, often termed as a DPP source.

The illumination system IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illumination system IL can be adjusted. In addition, the illumination system IL may comprise various other components, such as facetted field and pupil mirror devices. The illumination system IL may be used to condition the radiation beam B, to have a desired uniformity and intensity distribution in its cross-section.

The radiation beam B is incident on the patterning device (e.g., mask) MA, which is held on the support structure (e.g., mask table) MT, and is patterned by the patterning device MA. After being reflected from the patterning device (e.g., mask) MA, the radiation beam B passes through the projection system PS, which focuses the radiation beam B onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. The patterning device (e.g., mask) MA and the substrate W may be aligned using mask alignment marks M1, M2 and substrate alignment marks P1, P2.

A controller 500 controls the overall operations of the lithographic apparatus 100 and in particular performs an operation process described further below. Controller 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus 100. It will be appreciated that a one-to-one relationship between controlling computer and lithographic apparatus 100 is not necessary. In an embodiment of the invention one computer can control multiple lithographic apparatuses 100. In an embodiment of the invention, multiple networked computers can be used to control one lithographic apparatus 100. The controller 500 may also be configured to control one or more associated process devices and substrate handling devices in a lithocell or cluster of which the lithographic apparatus 100 forms a part. The controller 500 can also be configured to be subordinate to a supervisory control system of a lithocell or cluster and/or an overall control system of a fab.

Figure 2:
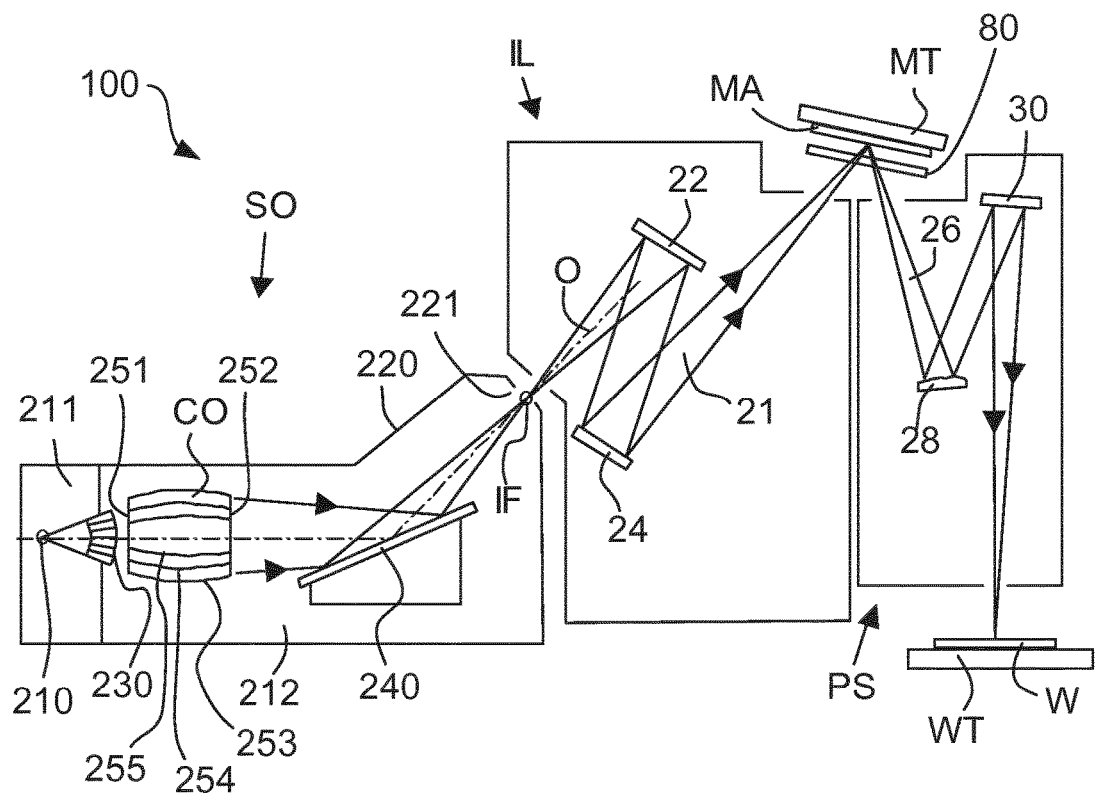
FIG. 2 is a more detailed view of the lithographic apparatus.

FIG. 2 shows the lithographic apparatus 100 in more detail, including the source collector module SO, the illumination system IL, and the projection system PS. An EUV radiation emitting plasma 210 may be formed by a plasma source. EUV radiation may be produced by a gas or vapor, for example Xe gas, Li vapor or Sn vapor in which the radiation emitting plasma 210 is created to emit radiation in the EUV range of the electromagnetic spectrum. In an embodiment, a plasma of excited tin (Sn) is provided to produce EUV radiation.

The radiation emitted by the radiation emitting plasma 210 is passed from a source chamber 211 into a collector chamber 212.

The collector chamber 212 may include a radiation collector CO. Radiation that traverses the radiation collector CO can be focused in a virtual source point IF. The virtual source point IF is commonly referred to as the intermediate focus, and the source collector module SO is arranged such that the virtual source point IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the unpatterned beam 21, at the patterning device MA, as well as a desired uniformity of radiation intensity at the patterning device MA. Upon reflection of the unpatterned beam 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in the illumination system IL and the projection system PS. Further, there may be more mirrors present than those shown in the Figures, for example there may be 1-6 additional reflective elements present in the projection system PS than shown in FIG. 2.

Alternatively, the source collector module SO may be part of an LPP radiation system.

As depicted in FIG. 1, in an embodiment the lithographic apparatus 100 comprises an illumination system IL and a projection system PS. The illumination system IL is configured to emit a radiation beam B. The projection system PS is separated from the substrate table WT by an intervening space. The projection system PS is configured to project a pattern imparted to the radiation beam B onto the substrate W. The pattern is for EUV radiation of the radiation beam B.

The space intervening between the projection system PS and the substrate table WT can be at least partially evacuated. The intervening space may be delimited at the location of the projection system PS by a solid surface from which the employed radiation is directed toward the substrate table WT.

In an embodiment the lithographic apparatus 100 comprises a dynamic gas lock. The dynamic gas lock comprises a membrane assembly 80. In an embodiment the dynamic gas lock comprises a hollow part covered by a membrane assembly 80 located in the intervening space. The hollow part is situated around the path of the radiation. In an embodiment the lithographic apparatus 100 comprises a gas blower configured to flush the inside of the hollow part with a flow of gas. The radiation travels through the membrane assembly before impinging on the substrate W.

In an embodiment the lithographic apparatus 100 comprises a membrane assembly 80. As explained above, in an embodiment the membrane assembly 80 is for a dynamic gas lock. In this case the membrane assembly 80 functions as a filter for filtering DUV radiation. Additionally or alternatively, in an embodiment the membrane assembly 80 is pellicle for the patterning device MA for EUV lithography. The membrane assembly 80 of the present invention can be used for a dynamic gas lock or for a pellicle or for another purpose such as a spectral purity filter. In an embodiment the membrane assembly 80 comprises a membrane 40, which may also be called a membrane stack. In an embodiment the membrane is configured to transmit at least 80% of incident EUV radiation.

In an embodiment the membrane assembly 80 is configured to seal off the patterning device MA to protect the patterning device MA from airborne particles and other forms of contamination. Contamination on the surface of the patterning device MA can cause manufacturing defects on the substrate W. For example, in an embodiment the pellicle is configured to reduce the likelihood that particles might migrate into a stepping field of the patterning device MA in the lithographic apparatus 100.

If the patterning device MA is left unprotected, the contamination can require the patterning device MA to be cleaned or discarded. Cleaning the patterning device MA interrupts valuable manufacturing time and discarding the patterning device MA is costly. Replacing the patterning device MA also interrupts valuable manufacturing time.

Figure 3:
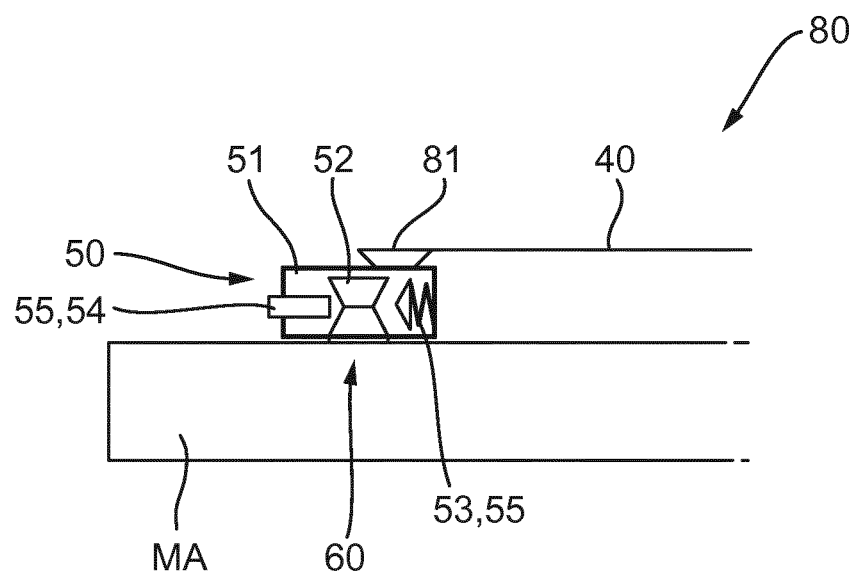
FIG. 3 schematically depicts, in cross-section, part of a membrane assembly according to an embodiment of the invention.

FIG. 3 schematically depicts, in cross-section, part of a membrane assembly 80 according to an embodiment of the invention. The membrane assembly 80 is for EUV lithography. The membrane assembly 80 comprises a membrane 40. The membrane 40 is emissive for EUV radiation. Of course the membrane 40 may not have 100% emissivity for EUV radiation. However, the membrane may have, for example, at least 50% emissivity, preferably at least 85%, even more preferably at least 95% emissivity for EUV radiation. As shown in FIG. 3, in an embodiment the membrane 40 is substantially planar. In an embodiment the plane of the membrane 40 is substantially parallel to the plane of the patterning device MA.

The membrane assembly 80 has a shape such as a square, a circle or a rectangle, for example. The shape of the membrane assembly 80 is not particularly limited. The size of the membrane assembly 80 is not particularly limited. For example, in an embodiment the membrane assembly 80 has a diameter in the range of from about 100 mm to about 500 mm, for example about 200 mm.

As depicted in FIG. 3, in an embodiment the membrane assembly 80 comprises a border 81. The border 81 is configured to hold the membrane 40. The border 81 provides mechanical stability to the membrane 40. The border 81 is configured to reduce the possibility of the membrane 40 being deformed away from its planar shape. In an embodiment, a pre-tension is applied to the membrane 40 during its manufacture. The border 81 is configured to maintain the tension in the membrane 40 so that the membrane 40 does not have an undulating shape during use of the lithographic apparatus 100. In an embodiment the border 81 extends along the perimeter of the membrane 40. The outer periphery of the membrane 40 is positioned on top of the border 81 (according to the view of FIG. 3). The border 81 may be at least partly formed by part of the membrane 40 which is left over from the process of manufacturing the membrane assembly 80. Hence the border 81 may not be a separate component from the membrane 40 (i.e. is an integral part of the membrane).

The thickness of the border 81 is not particularly limited. For example, in an embodiment the border 81 has a thickness of at least 300 μm, optionally at least 400 μm. In an embodiment the border 81 has a thickness of at most 1,000 μm, optionally at most 800 μm. In an embodiment the border 81 has a width of at least 1 mm, optionally at least 2 mm, optionally at least 4 mm. In an embodiment the border 81 has a width of at most 10 mm, optionally at most 5 mm, optionally at most 4 mm.

As depicted in FIG. 3, in an embodiment the membrane assembly 80 comprises a frame assembly 50. The frame assembly 50 is connected to the border 81. In an embodiment the frame assembly 50 comprises a frame surface in contact with the border 81. In an embodiment the frame assembly 50 is initially manufactured as a separate component from the border 81 and subsequently connected to the border 81. For example, the combination of the membrane 40 with the border 81 may be manufactured together, while the frame assembly 50 may be manufactured separately. In a subsequent manufacturing step, the frame assembly 50 may be attached or fixed to the border 81.

In an embodiment the frame assembly 50 has a width of at least 2 mm, optionally at least 5 mm, optionally at least 8 mm. In an embodiment the frame assembly 50 has a width of at most 20 mm, optionally at most 10 mm, optionally at most 8 mm.

In an embodiment the frame assembly 50 comprises a frame 51. The frame 51 is the part of the frame assembly 50 that is connected to the border 81. In an embodiment the frame 51 is made of the same material as the border 81. For example, in an embodiment both the border 81 and the frame 51 are made of a material comprising silicon. In an embodiment the border 81 is made of silicon. In an embodiment the frame 51 is made of silicon. In an embodiment the thermal expansion of the border 81 substantially matches the thermal expansion of the frame 51. In an embodiment the frame 51 is attached to the border 81 by an adhesive. In an embodiment the thermal expansion of the adhesive substantially matches the thermal expansion of the frame 51 and/or the border 81.

As depicted in FIG. 3, the frame assembly 50 is configured to attach to the patterning device MA. In an embodiment the frame assembly 50 comprises a frame surface configured to contact the patterning device MA. The frame assembly 50 is for holding the position of the membrane 40 relative to the patterning device MA. Although the embodiment is described with reference to a patterning device MA, the invention is equally applicable to a membrane assembly 80 that connects to a different component other than the patterning device MA.

In an embodiment the frame assembly 50 is connected to the border 81 in a direction perpendicular to the plane of the membrane 40. This is shown in FIG. 3. In FIG. 3, the plane of the membrane 40 extends left to right and into and out of the paper. The direction perpendicular to the plane of the membrane 40 corresponds to the vertical (i.e. up and down) direction in FIG. 3. The frame assembly 50 is connected directly below the border 81. The frame assembly 50 being connected to the border 81 in a direction perpendicular to the plane of the membrane 40 is to be understood that the border 81 and the frame assembly 50 are aligned in a vertical direction (i.e. in a direction perpendicular to the surface of the patterning device MA and of the membrane 40) such that a vertical line can be drawn that extends through both the border 81 and the frame assembly 50, as shown in FIG. 3. In an embodiment the interface between the border 81 and the frame assembly 50 is in a plane that is substantially parallel to the plane of the membrane 40.

In an embodiment the membrane assembly 80 is configured to be removable from the patterning device MA. This allows intermediate inspections of the patterning device MA to take place. In an embodiment the frame assembly 50 is configured to be repeatedly attached to and detached from the patterning device MA.

In use, the frame assembly 50 is between the border 81 and the patterning device MA. The term "between" herein means that the frame assembly 50 extends under the border 81 and it is positioned on the top of a surface of the patterning device. This arrangement is different from arrangements in which the frame assembly is positioned radially outwards from the border. An embodiment of the invention is expected to achieve a reduction in space around the membrane 40 required to hold the membrane 40 in position relative to the patterning device MA.

According to a comparative example, a membrane assembly has a frame assembly radially outwards from the border, as described for example in WO 2016/079051 A2. The frame assembly is required to be accessed in the radial direction so as to attach/detach the frame assembly to/from the patterning device. A space of about 16 mm may be required to accommodate the border, the frame assembly and space for accessing the frame assembly.

In contrast in an embodiment the frame assembly 50 is positioned below the border 81, thereby reducing radial space required to accommodate the border 81 and the frame assembly 50. For example, in an embodiment the radial space required to accommodate the border 81, the frame assembly 50 and space for accessing the frame assembly 50 is about 12 mm.

An embodiment of the invention is expected to achieve a reduction in the required space in the region of the patterning device MA for mounting features. Mounting features are features that are used to mount the membrane assembly 80 onto the patterning device MA. In an embodiment a mounting feature is provided between the border 81 and the patterning device MA, it is therefore not extending radially outwards from the border. In an embodiment at least one mounting feature is in contact with the patterning device and is substantially perpendicular the surface of the patterning device. This is shown in FIG. 3 and will be explained in further detail below.

In an embodiment the frame assembly 50 comprises at least one hole 52. In an embodiment the hole 52 is a cavity or chamber or an opening within the frame 51 of the frame assembly 50. The hole 52 is configured to receive a protrusion (e.g. a stud 60). The stud 60 is in direct contact with and protrudes from the patterning device MA. In an alternative embodiment the frame assembly 50 is permanently attached to the patterning device MA and the stud 60 is in direct contact with and protrudes from the border 81 of the membrane assembly 80.

FIG. 3 shows the stud 60 fixed to the patterning device MA. In an embodiment the stud 60 is glued onto the patterning device MA using an adhesive. Alternatively, the stud 60 may be formed integrally with the patterning device MA. As a further alternative, the stud 60 may be initially manufactured as a separate component from the patterning device MA and subsequently fixed to the patterning device MA using means other than an adhesive, for example a screw.

The stud 60 and the hole 52 are mounting features. In an embodiment the stud 60 and the hole 52 are provided between the border 81 and the patterning device MA. This is different from previously known arrangements in which the mounting features are positioned radially outwards from the border 81.

As depicted in FIG. 3, in an embodiment the hole 52 at least partially overlaps the border 81 when viewed in the direction perpendicular to the plane of the membrane 40. This is shown in FIG. 3, where the hole 52 partially overlaps the border 81 when viewed in the vertical direction. Looking at FIG. 3, a vertical line can be drawn that extends through both the border 81 and the hole 52.

In an embodiment the frame assembly 50 comprises a locking mechanism 55. In an embodiment the locking mechanism 55 is located in hole 55, which forms a cavity or a chamber within the frame 51. The cavity formed in frame 55 may be partially open, or it may fully surround the locking mechanism 55. The locking mechanism 55 is configured to lock the frame assembly 50 to the stud 60. In an embodiment the locking mechanism 55 comprises a resilient member 53. In an embodiment the locking mechanism 55 comprises a resilient member 53 for each hole 52. In an embodiment the frame assembly 50 comprises a plurality of holes 52, for example two, three, four or more holes 52. A resilient member 53 is provided corresponding to each hole 52. In an embodiment the resilient member 53 is coupled to the frame 51. In an embodiment the resilient member 53 is located inside hole 52 and coupled with one section to frame 51, whereas another section of the resilient member is available for locking and unlocking the frame assembly from the patterning device MA. In an embodiment, the direction of the forces exerted on the protrusion by the resilient member 53 and the locking mechanism 55 is parallel with the membrane 40 and the patterning device MA. In an embodiment the resilient member is arranged inside hole 52 and attached to frame 51 such that it will push onto a side surface of the protrusion, in a direction parallel to the membrane 40, as shown in FIG. 3.

As depicted in FIG. 3, in an embodiment the resilient member 53 comprises a spring. For example, the spring may be a coil spring or a leaf spring. In an alternative embodiment the resilient member 53 comprises a resilient material such as rubber. In an alternative embodiment the resilient member 53 comprises a flexure. The flexure may be machined using an electrical discharge machining process, for example.

Figure 4:
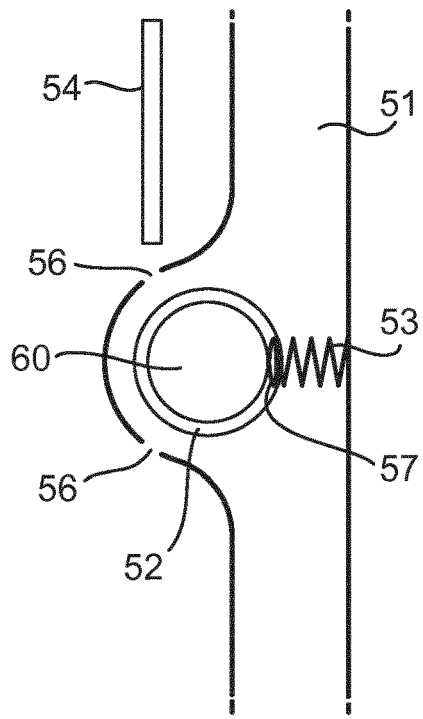
FIGS. 4 to 6 schematically depict, in plan, stages of using a locking mechanism of a membrane assembly according to an embodiment of the invention.
Figure 5:
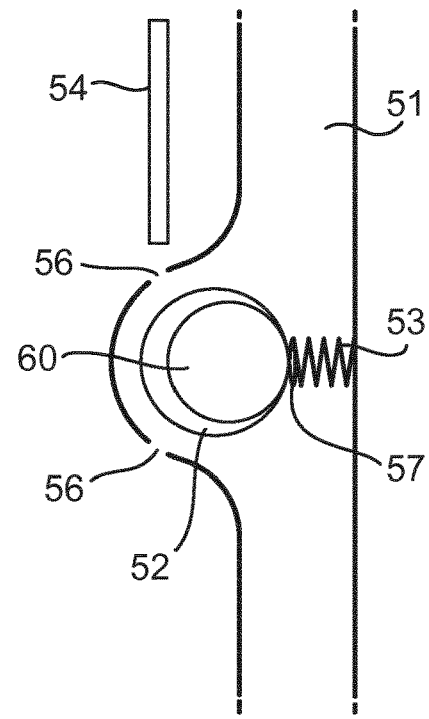
Figure 6:
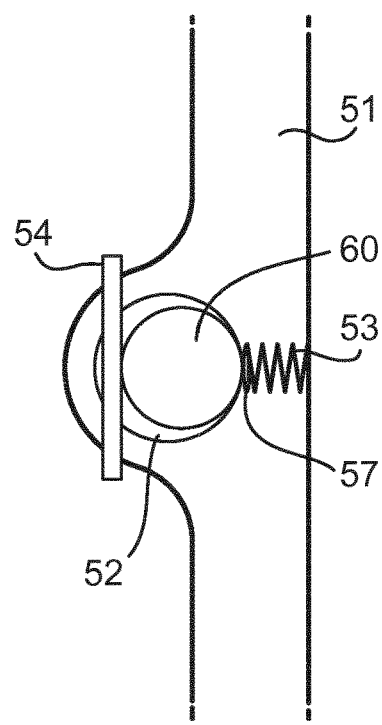

FIGS. 4 to 6 schematically depict stages of use of the locking mechanism 55. FIGS. 4 to 6 are shown in plan view. FIG. 4 depicts an initial state in which the frame assembly 50 is positioned over the stud 60 so that the stud 60 is received into the hole 52. The resilient member 53 is not compressed. As depicted in FIG. 4, the resilient member 53 extends into the hole 52. Accordingly, the stud 60 can come into contact with the resilient member 53 when the stud 60 is received into the hole 52. The resilient member 53 is configured to be deformable (e.g. compressible) when the stud 60 received in the hole 52 presses against the resilient member 53 in a direction within the plane of the membrane 40. For example, in FIG. 4 the stud 60 can press against the resilient member 53 in the direction to the right in the Figure.

As depicted in FIGS. 3 to 6, in an embodiment the locking mechanism 55 comprises a locking member 54 for each hole 52. The locking member 54 is configured to be movable to a locking position where the locking member 54 extends into the hole 52. In the locking position the compressed resilient member 53 exerts a force on the stud 60 received in the hole 52 towards the locking member 54. This is shown in the sequence from FIG. 4 to FIG. 6.

As shown in the transition from FIG. 4 to FIG. 5, the stud 60 and the frame assembly 50 are moved relative to each other so that the stud 60 presses against the resilient member 53. The stud 60 compresses the resilient member 53, as shown in FIG. 5.

As shown in the transition from FIG. 5 to FIG. 6, the locking member 54 is moved to the locking position where the locking member 54 extends into the hole 52. For example, as shown in FIGS. 4 to 6, in an embodiment the frame assembly 50 comprises at least one locking aperture 56. The locking member 54 passes through the locking apertures 56.

FIG. 6 shows the locking member 54 in the locking position. The resilient member 53 exerts a force on the stud 60 in the direction of the locking member 54. In the situation shown in FIG. 5, an external force is required to be exerted on the frame assembly 50 and/or on the stud 60 so that the stud 60 compresses the resilient member 53. Once the locking member 54 is in the locking position (e.g. as shown in FIG. 6), it is no longer necessary for the external force to be applied. This is because the locking member 54 holds the stud 60 and the frame assembly 50 in position relative to each other.

As explained above, the stud 60 is positioned under the border 81, instead of radially outward of the border 81. This may require an increase in the distance (also known as standoff) between the patterning device MA and the membrane 40. The distance between the surface of the patterning device MA and the membrane 40 substantially corresponds to the combined height of the frame assembly 50 and the border 81. In an embodiment the combined height of the frame assembly 50 and the border 81 is at least 1 mm, at least 2 mm, and optionally at least 5 mm. In an embodiment the combined height of the frame assembly 50 with the border 81 is at most 20 mm, optionally at most 10 mm, and optionally at most 5 mm.

In an embodiment the protrusion (stud 60) and the locking mechanism 55 are located inside the hole (cavity) 52. In an embodiment the protrusion and the locking mechanism 55 comprising the locking member 54 and the resilient member 53 are located inside hole 52. In an embodiment a surface of the cavity formed in frame 51 has a surface in direct contact with the border 81. In an embodiment the frame assembly 50, comprising frame 51 which defines hole 52 encompassing mounting features to attach the frame 51 to the patterning device MA, is in direct contact with and below border 81 such that the frame assembly comprising the mounting features is arranged in between the border 81 and the patterning device MA. In an embodiment the hole 52 is formed by the frame which is more rigid than the resilient member. Therefore, the resilient member 53 is more deformable than the frame 51 in which hole 52 is formed, such that when in locking position, it is the resilient member 53 (and thus not frame 51) which is deformed under compression. Thus, the cavity will not resiliently deform (i.e. it keep its rigid shape) when the resilient member 53 and the locking mechanism 54 are in contact with protrusion 60.

In an embodiment the resilient member 53 comprises a spring made of a material such as stainless steel. In an embodiment the resilient member 53 is connected to a contact pad 57 made of a different material from the resilient member 53. For example, the contact pad 57 may be made of the same material as the stud 60 and/or the locking member 54. In an embodiment the contact pad 57 comprises titanium. In an embodiment the locking member 54 comprises titanium. In an embodiment the stud 60 comprises titanium. Titanium is known to provide a ductile contact. However, in an alternative embodiment, other materials can be used for the contact pad 57, the stud 60 and the locking member 54.

As shown in FIGS. 4 to 6, in an embodiment the cross-sectional area of the hole 52 is greater than the cross-sectional area of the stud 60 in plan view. The hole 52 is oversized relative to the stud 60. In an embodiment the resilient member 53 is provided against an end stop (not shown in the Figures). The resilient member 53 protrudes into the hole 52 when viewed in plan view (as shown in FIG. 4). Accordingly, the resilient member 53 effectively reduces the cross-sectional area of the hole 52 in plan view. The remaining cross-sectional dimensions of the hole 52 are larger than the dimensions of the stud 60. Accordingly, the stud 60 can be received into the hole 52 when the frame assembly 50 is moved vertically over the stud 60. The frame assembly 50 is pushed sideways against the resilient member 53 so that the resilient member 53 is deflected inwards. The locking member 54 is placed preventing the frame assembly 50 from bending back. In an embodiment the locking member 54 is a pin. The locking member 54 can be inserted from the side or from the top. After the locking member 54 has been inserted, the frame assembly 50 is locked to the patterning device MA.

In an embodiment the frame assembly 50 comprises four holes 52 evenly distributed around the frame assembly 50. In an embodiment the frame assembly 50 has a similar shape to the border 81, following the perimeter of the membrane 40. FIG. 3 depicts the resilient member 53 radially inward of the hole 52. However, this is not necessarily the case. The resilient member 53 may be radially outward of the hole 52 or neither radially inward nor outward relative to the hole 52. The hole 52 is positioned between the resilient member 53 and the locking member 54.

In an embodiment a resilient member 53 is radially inward of a hole 52 at one side of the membrane assembly 80, whereas another resilient member 53 is radially outward of another hole 52 at the opposite side of the membrane assembly 80. This allows the studs 60 at opposite sides of the patterning device MA to compress both resilient members 52 with one movement of the membrane assembly 80 relative to the patterning device MA. In an embodiment the membrane assembly 80 is configured such that all of the studs 60 received in corresponding holes 52 compress corresponding resilient members 52 with one movement of the membrane assembly 80 relative to the patterning device MA.

As shown in FIGS. 4 to 6, in an embodiment the locking member 54 is provided as a loose part. In an alternative embodiment the locking member may be formed to be integral with the rest of the frame assembly 50, provided that the locking member 54 can be slid into the locking position.

In an embodiment the stud 60 has a diameter (in plan view) of at least 1 mm, optionally at least 2 mm, and optionally at least 3 mm. In an embodiment the stud 60 has a diameter of at most 10 mm, optionally at most 5 mm, and optionally at most 3 mm.

As explained above, in an embodiment the resilient member 53 extends into the hole 52 when it is not compressed. In an embodiment the resilient member 53 extends into the hole 52 by a distance of at least 0.1 mm, optionally at least 0.2 mm, and optionally at least 0.5 mm. In an embodiment the resilient member 53 extends into the hole 52 by a distance of at most 2 mm, optionally at most 1 mm, and optionally at most 0.5 mm.

As mentioned above, the hole 52 has a diameter that is larger than the diameter of the stud 60. In an embodiment the diameter of the hole is greater than the diameter of the stud 60 by at least 0.2 mm, optionally at least 0.5 mm, and optionally at least 1 mm. In an embodiment the diameter of the hole 52 is greater than the diameter of the stud 60 by at most 5 mm, optionally at most 2 mm, and optionally at most 1 mm. In an embodiment the locking member 54 has a length of at least 1 mm, optionally at least 2 mm, and optionally at least 4 mm.

In an embodiment the locking member 54 has a length of at most 10 mm, optionally at most 5 mm, and optionally at most 4 mm. In an embodiment the locking member 54 has a width of at least 0.2 mm, optionally at least 0.5 mm, and optionally at least 1 mm. In an embodiment the locking member 54 has a width of at most 5 mm, optionally at most 2 mm, and optionally at most 1 mm.

An embodiment of the invention is expected to achieve a reduction in tooling steps required for attaching/detaching the member assembly 80 to/from the patterning device MA.

Figure 11:
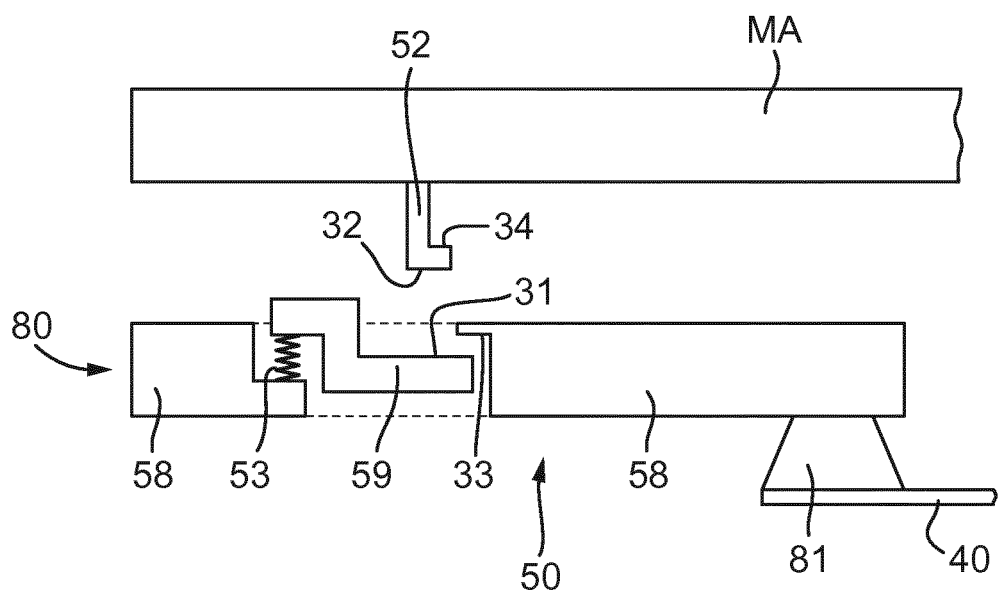
FIGS. 11 to 14 schematically depict, in cross-section, various stages of a process of mounting a membrane assembly according to an embodiment of the invention being mounted onto a patterning device.

FIG. 11 schematically depicts, in cross-section, a membrane assembly 80 according to an alternative embodiment of the invention. The membrane assembly 80 is for EUV lithography.

The membrane assembly 80 comprises a planar membrane 40. Only part of the membrane 40 is shown in FIG. 11. The membrane assembly 80 comprises a frame assembly 50. FIG. 11 shows a cross-sectional view of the frame assembly 50 on one side of the membrane 40. The frame assembly 50 is configured to hold the membrane 40. The frame assembly 50 is configured to attach to a patterning device MA for EUV lithography. As depicted in FIG. 11, in an embodiment the frame assembly 50 is configured to hold the membrane 40 via a border 81. The construction of the membrane 40 and the border 81 can be the same as in any of the other embodiments described in this document.

Figure 12:
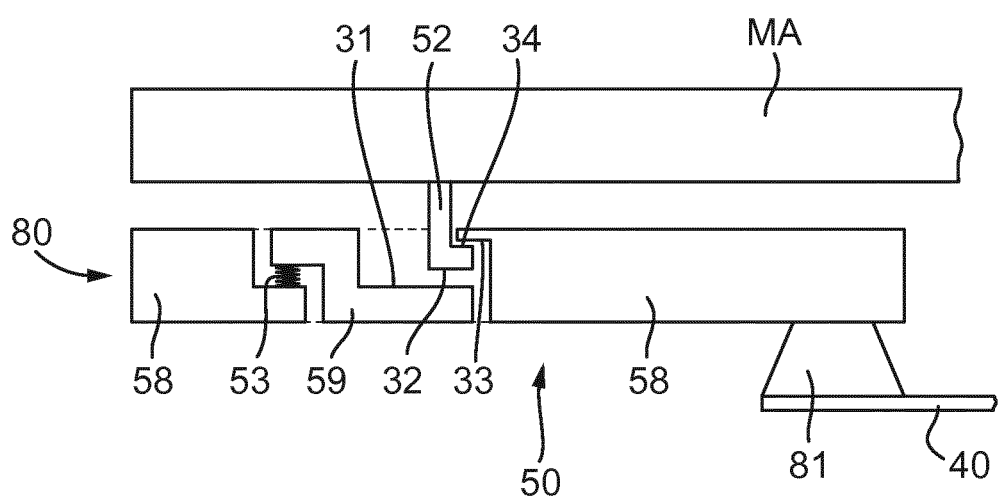
Figure 13:
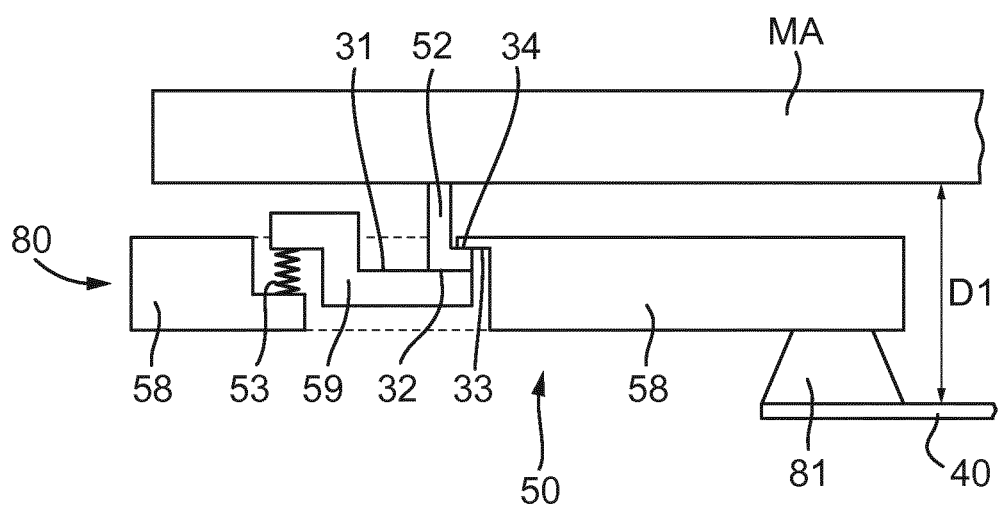

FIGS. 11 to 14 schematically depict various stages of a process of attaching the frame assembly 50 to the patterning device MA. FIG. 13 schematically depicts the frame assembly 50 attached to the patterning device MA. As depicted in FIG. 13, in an embodiment the frame assembly 50 has a locked state. In the locked state, the frame assembly 50 is locked to the patterning device MA such that the membrane 40 is held a predetermined distance D1 from the patterning device MA. The predetermined distance is shown in FIG. 13. The predetermined distance D1 is measured in the direction perpendicular to the plane of the membrane 40 and the plane of the patterning device MA. The frame assembly 50 is biased into the locked state by the resilient member 53.

Figure 14:
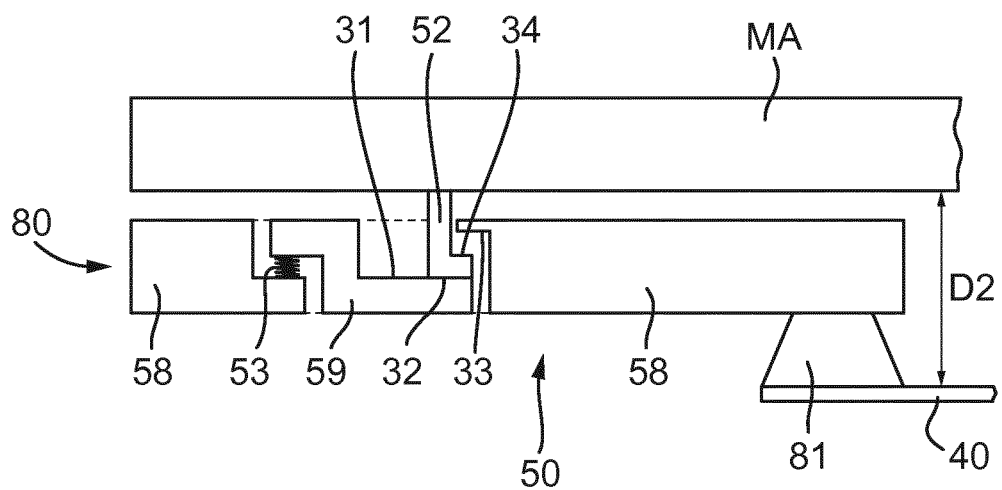

As depicted in FIG. 14, in an embodiment the frame assembly 50 has an unlocked state. In the unlocked state the membrane assembly 50 is not locked to the patterning device MA. In the unlocked state, the membrane 40 is less than the predetermined distance D1 from the patterning device MA. For example, as shown in FIG. 14, in the unlocked state the membrane 40 is an unlocked state distance D2 from the patterning device MA. The unlocked state distance D2 is less than the predetermined distance D1. As shown from a comparison between FIG. 13 and FIG. 14, in the unlocked state the resilient member 53 is compressed, with a membrane holder 58 of the frame assembly 50 forced closer to the patterning device MA.

Figure 15:
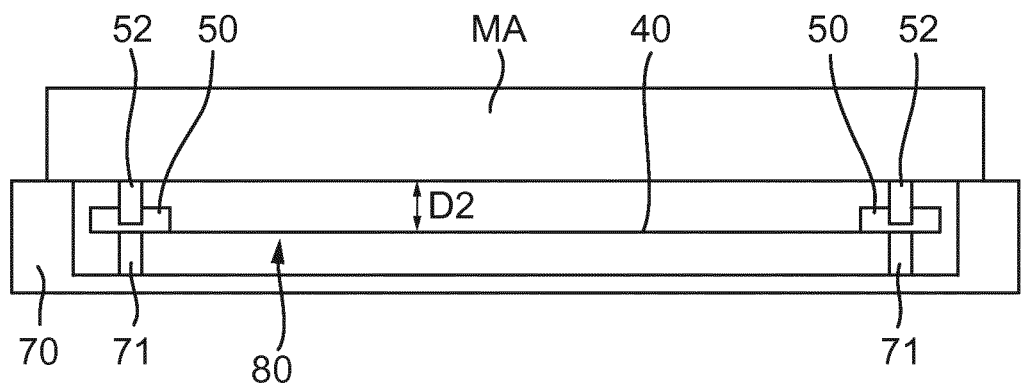
FIG. 15 schematically depicts, in cross-section, a membrane assembly according to an embodiment of the invention in a loading apparatus.
Figure 16:
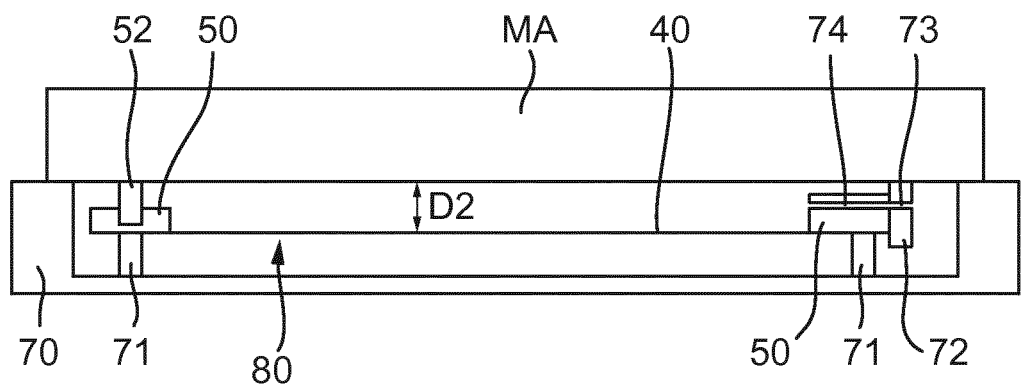
FIGS. 16 and 17 schematically depict, in cross-section, a membrane assembly according to an embodiment of the invention being removed from a loading apparatus.
Figure 17:
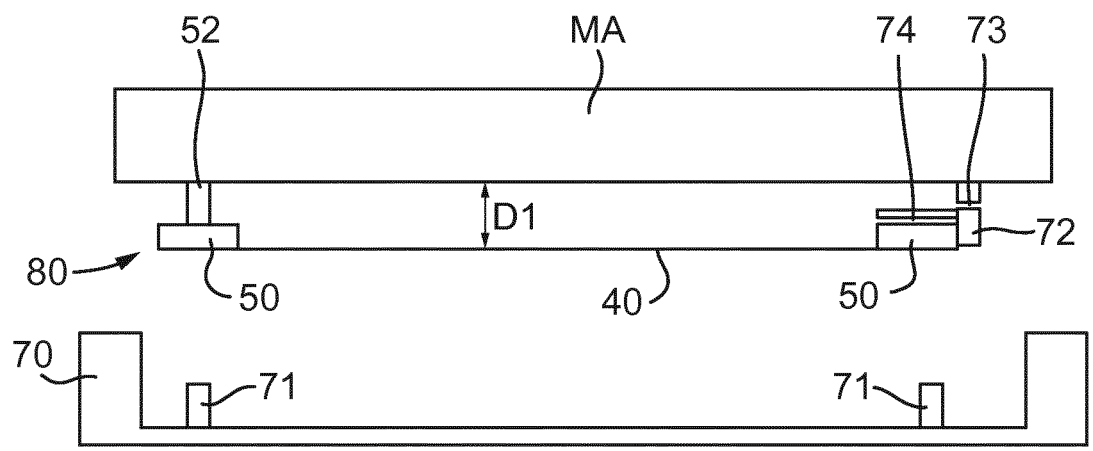

The membrane 40 is used for mitigating any defect in the front side of the patterning device MA. The membrane 40 reduces the possibility of contaminant particles reaching the patterning device MA. In an embodiment the membrane assembly 80 is loaded into the lithographic apparatus 100 in a loading apparatus 70 (shown in FIGS. 15 to 17). As shown in FIGS. 15 to 17, in an embodiment the loading apparatus 70 comprises a cutout portion for accommodating the membrane 40. It is desirable for the loading apparatus 70 to be as thin as possible. The thickness of the loading apparatus 70 is shown in the up and down directions in FIGS. 15 to 17.

In practice, the membrane 40 can sag under its own weight. It is desirable for the membrane 40 to avoid touching the inside of the loading apparatus 70, so as to avoid any damage to the membrane 40. It is desirable for the membrane 40 to be thin so as to be able to transmit a higher proportion of EUV radiation. However, thinner membranes 40 tend to sag more. Hence, there is a trade-off between the thinness of the membrane 40 and the thinness of the loading apparatus 70.

It is desirable for there to be a large standoff between the membrane 40 and the patterning device MA in use of the lithographic apparatus 100. The standoff is the distance between the patterning device MA and the membrane 40 when the lithographic apparatus 100 is in use. Accordingly, it is not desirable to increase the space for the membrane 40 to sag simply by reducing the standoff between the membrane 40 and the patterning device MA.

Instead, the embodiment shown in FIGS. 11 to 14 allows the membrane 40 to be temporarily pressed towards the patterning the device MA while the membrane 40 is being transported in the loading apparatus 70. For example, FIGS. 15 and 16 show the membrane 40 in the temporary state of being pressed upwards towards the patterning device MA. This allows the membrane 40 to sag more without touching the inside of the loading apparatus 70. Meanwhile, FIG. 17 shows the membrane assembly 80 out of the loading apparatus 70. The membrane 40 is no longer pressed upwards towards the patterning device MA such that the membrane 40 has the predetermined distance D1 from the patterning device MA. Such arrangement enables the variation of the distance between the membrane 40 and the patterning device MA on a direction perpendicular to the patterning device. Increasing the distance between the membrane 40 adds clearance for the membrane, which allows venting times and pump down times to be shorter.

Accordingly, an embodiment of the invention is expected to allow the membrane 40 to be made according to a greater level of design freedom (because a greater level of sagging is allowed), without increasing the thickness of the loading apparatus 70.

As depicted in FIG. 11, in an embodiment the frame assembly 50 comprises a resilient member 53. In an embodiment the resilient member 53 comprises a preload spring. The resilient member 53 may be a torsion spring or a leaf spring, for example. As depicted in FIG. 11, in an embodiment the frame assembly 50 comprises a membrane holder 58. The membrane holder 58 is configured to hold the membrane 40. The membrane holder 58 makes up most of the frame assembly 50. The membrane holder 58 has a fixed position relative to the membrane 40. When the membrane holder 58 moves, the membrane 40 also moves together with the membrane holder 58.

As depicted in FIG. 11, in an embodiment the membrane holder 58 comprises an end stop surface 33. The end stop surface 33 is configured to contact a locking surface 34 of the stud 52 protruding from the patterning device MA. When the frame assembly 50 is in the locked state, the end stop surface 33 of the membrane holder 58 abuts the locking surface 34 of the stud 52.

In an embodiment the end stop surface 33 is on top of the locking surface 34 of the stud 52. This is different from previously known mechanisms in which a fixed end stop is positioned below the stud. According to the present invention, the membrane holder 58 can be pressed upward, against the resilient member 53.

As depicted in FIG. 11, in an embodiment the frame assembly 50 comprises a clamping member 59. The clamping member 59 is movable relative to the membrane holder 58. In an embodiment the frame assembly 50 comprises a resilient member 53. The resilient member 53 connects the membrane holder 58 to the clamping member 59. The membrane holder 58 can move relative to the clamping member 59 by compression of the resilient member 53. The membrane holder 58 is movable relative to the clamping member 59 in a direction perpendicular to the plane of the membrane 40.

FIG. 11 depicts a point in time in which the frame assembly 50 is in an initial state. In the initial state, the resilient member 53 is in a substantially uncompressed state. The frame assembly 50 cannot fit over the stud 52 because there is insufficient space between the end stop surface 33 of the membrane holder 58 and the abutment surface 31 of the clamping member 59. The abutment surface 31 is configured to contact an engagement surface 32 of the stud 52. The engagement surface 32 of the stud 52 faces away from the patterning device MA.

FIG. 12 schematically depicts the frame assembly 50 in a preparatory state. In the preparatory state, the resilient member 53 is compressed such that the distance between the end stop surface 33 of the membrane holder 58 and the abutment surface 31 of the clamping member 59 is increased. A special tool may be used to perform this operation. In particular, the tool may be used to hold the clamping member 59. With the clamping member 59 held in position, the tool is used to apply a force pressing the membrane holder 58 in the direction of the patterning device MA. Accordingly, the resilient member 53 is compressed and the membrane holder 58 is forced towards the patterning device MA. The frame assembly 50 and the patterning device MA are then maneuvered with respect to each other such that the stud 52 (or part of the stud 52) enters between the end stop surface 33 of the membrane holder 58 and the abutment surface 31 of the clamping member 59.

FIG. 13 depicts the frame assembly 50 in the locked state. In the transition from the preparatory state shown in FIG. 12 to the locked state shown in FIG. 13, the force on the membrane holder 58 is released. As a result, the resilient member 53 expands. The abutment surface 31 of the clamping member 59 comes into contact with the engagement surface 32 of the stud 52. The end stop surface 33 of the membrane holder 58 comes into contact with the locking surface 34 of the stud 52. The locking surface 34 of the stud 52 faces towards the patterning device MA.

FIG. 14 schematically depicts the frame assembly 50 in the unlocked state. In the unlocked state, the abutment surface 31 of the clamping member 59 remains in contact with the engagement surface 32 of the stud 52. The membrane holder 58 is forced towards the patterning device MA such that the end stop surface 33 of the membrane holder 58 moves away from the locking surface 34 of the stud 52. Accordingly, the frame assembly 52 is no longer locked to the patterning device MA. The membrane 40 is closer to the patterning device MA compared to in the locked state shown in FIG. 13. When the resilient member 53 is compressed, the membrane holder 58 moves towards the patterning device MA.

FIG. 15 schematically depicts the membrane assembly 80 attached to the patterning device MA and stored in the loading apparatus 70. The loading apparatus 70 may alternatively be called a load lock or an inner pod. As shown in FIG. 15, in an embodiment the loading apparatus 70 comprises at least one protrusion 71. The protrusions 71 are for pressing up the membrane holder 58 of the frame assembly 50. The protrusions 71 protrude from the inside surface (or the base plate) of the loading apparatus 70.

As can be seen from FIG. 15, by pressing the resilient members 53 by the protrusions 71, the membrane holder 58 can be pressed towards the patterning device MA. This adds clearance for the membrane 40 towards the inner surface of the loading apparatus 70.

In an embodiment the distance between the membrane 40 and the inner surface of the loading apparatus 70 is increased from about 0.5 mm to about 1.5 mm by compressing the resilient members 53 by the protrusions 71. In an embodiment the clearance of the membrane 40 towards the patterning device MA is temporarily reduced from about 2.5 mm to about 1.5 mm. The clearance of the membrane 40 towards the patterning device MA is subsequently increased back up to about 2.5 mm when the membrane assembly 80 is released from the loading apparatus 70.

An embodiment of the invention is expected to reduce the risk of electrostatic discharge between the loading apparatus 70 and the membrane 40. This is because of the increased clearance between the membrane 40 and the inner surface of the loading apparatus 70.

As depicted in FIG. 16, in an embodiment the membrane assembly 80 comprises a sealing frame 72. The sealing frame 72 is provided to control the opening of the volume between the membrane 40 and the patterning device MA. In an embodiment the sealing frame 72 is positioned around the membrane 40. In an embodiment the sealing frame 72 comprises a plurality of seal openings 73. When the membrane holder 58 is pressed upwards towards the patterning device MA, frame openings 74 in the frame assembly 50 will line up with the seal openings 73 to allow high speed pressure equalization, as shown in FIG. 16. The frame openings 74 line up with the seal openings 73 so that gas (e.g. air) can pass through.

FIG. 17 schematically depicts the membrane assembly 80 outside of the loading apparatus 70. The seal openings 73 do not line up with the frame openings 74 such that the path for gas and particles is blocked. Accordingly, the sealing frame 72 seals the space between the membrane 40 and the patterning device MA.

Figure 18:
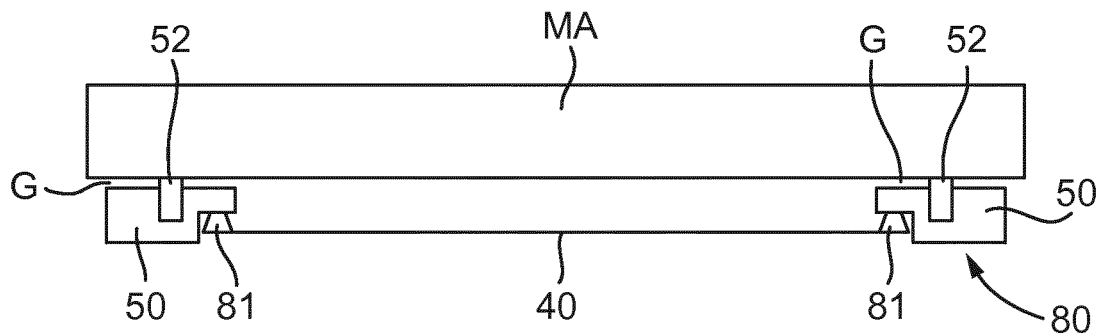
FIG. 18 schematically depicts, in cross-section, a gap between a membrane assembly according to an embodiment of the invention and a patterning device.

FIG. 18 schematically depicts a gap G between the membrane assembly 80 and the patterning device MA. In positions where the studs 52 are not provided, contaminant particles can potentially pass through the gap G and enter into the space or region between the patterning device MA and the membrane 40. The gap G may have a thickness of about 300 μm, for example.

The membrane assembly 80 is vulnerable to allowing particles that are smaller than the size of the gap G to reach the space between the membrane 40 and the patterning device MA. For example, contaminant particles that originate from outside of the space and have a size of less than about 200 µm can pass through the gap G either in a straight line or with some bouncing between the patterning device MA and the frame assembly 50.

Figure 19:
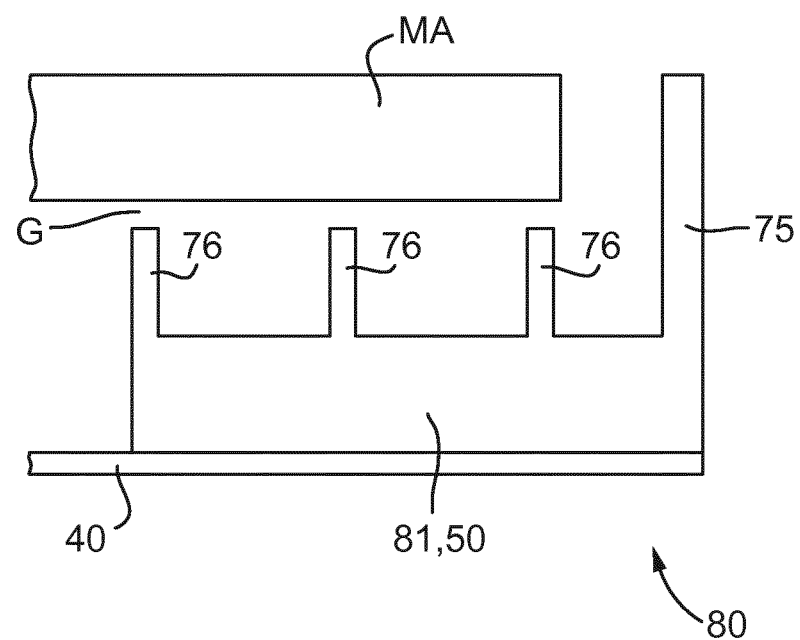
FIG. 19 schematically depicts, in cross-section, a membrane assembly according to an embodiment of the invention.

FIG. 19 schematically depicts, in cross-section, a variation of a membrane assembly 80. This variation shown in FIG. 19 can be applied to any of the embodiments of the membrane assembly 80 described in this document.

The variation of the membrane assembly 80 shown in FIG. 19 is for reducing the possibility of particles entering the region between the membrane 40 and the patterning device MA from outside that region. Additionally, variation of the membrane assembly 80 shown in FIG. 19 is for reducing the possibility of particles that originate in the gap G exiting the region between the membrane 40 and the patterning device MA. As depicted in FIG. 19, in an embodiment the membrane assembly 80 comprises a frame assembly 50 configured to hold the membrane 40 and to attach to the patterning device MA. A gap G is formed between opposing surfaces of the frame assembly 50 and the patterning device MA.

In an embodiment the frame assembly 50 comprises an elongate baffle 75. The elongate baffle 75 is configured to restrain contaminant particles from entering the gap G. As shown in FIG. 19, the elongate baffle 75 extends beyond the opposing surface of the patterning device MA. In an embodiment the elongate baffle 75 extends beyond the opposing surface of the patterning device MA at a location beyond the planar extent of the patterning device MA.

The membrane assembly 80 reduces the possibility of particles reaching the space between the patterning device MA and the membrane 40. As depicted in FIG. 19, in an embodiment the frame assembly 50 comprises at least one further baffle 76. Each further baffle 76 is configured to restrain contaminant particles from entering the gap G. Each further baffle 76 extends towards the patterning device MA.

In an embodiment the frame assembly 50 comprises three or four grooves (i.e. spaces between the elongate baffle 75 and each of the further baffles 76). In an embodiment the grooves do not have equal widths. In other words the elongate baffle 75 and the further baffles 76 may not be equally spaced. Particles that are released within the region between the membrane 40 and the patterning device MA (e.g. particles released from the side of the membrane 40 facing the patterning device MA) and travel towards the frame assembly 50 are less likely to be reflected back to the patterning device MA. The particles can become trapped within the grooves.

In an embodiment the elongate baffle 75 has a height of greater than or equal to about 1 mm. In an embodiment the distance between the elongate baffle 75 (and further baffles 76) and the patterning device MA is selected so as to encourage pressure equalization during operation of the lithographic apparatus 100. In an embodiment the distance between the elongate baffle 75 and the nearest further baffle 76 is about 300 µm. In an embodiment the distance between the further baffle 76 closest to the elongate baffle 75 and the next further baffle 76 is about 1.2 to 1.5 times greater than the distance between the elongate baffle 75 and the nearest further baffle 76. In an embodiment the distance between the further baffle 76 in the middle of the three shown in FIG. 19 and the further baffle 76 that is furthest from the elongate baffle 75 is about 1.2 to 1.5 times the distance between the two further baffles 76 in the center and to the right of the three further baffles 76 shown in FIG. 19. In an embodiment each further baffle 76 has a height of about 600 µm. In an embodiment the width of the grooves between baffles increases by about 20 to 50 percent in the direction from the elongate baffle 75.

In an embodiment the elongate baffle 75 and the further baffles 76 are positioned between the center of the patterning device MA and the studs 52. Accordingly, the baffle structures can constrain particles of, for example, titanium alloy, released by the studs 52. Hence, in an embodiment the elongate baffle 75 extends beyond the opposing surface of the patterning device MA at a location that is not beyond the planar extent of the patterning device MA.

In an embodiment the elongate baffle 75 and/or the further baffles 76 are made of a material that has a high Hamaker constant. In an embodiment the frame assembly 50 is made of a material that has a high Hamaker constant. An embodiment of the invention is expected to reduce the possibility of particles with a large range of sizes, materials, travel speeds and angles of incidence from reaching the patterning device MA.

Figure 7:
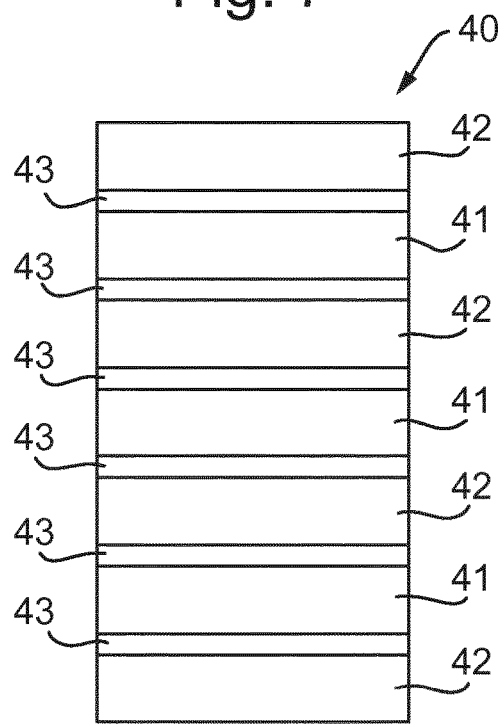
FIGS. 7 to 10 schematically depict, in cross-section, membranes according to different embodiments of the invention.

FIG. 7 schematically depicts, in cross-section, a membrane 40 according to an embodiment of the invention. As shown in FIG. 7, the membrane 40 comprises a stack. The stack comprises a plurality of layers.

In an embodiment the stack comprises at least on silicon layer 41. The silicon layer 41 comprises a form of silicon. In an embodiment the stack comprises at least one silicon compound layer 43. The silicon compound layer 43 is made of a compound of silicon and another element selected from the group consisting of boron, phosphorus, bromine and sulphur. However, other elements may also be used. In particular, in an embodiment the element that combines with the silicon to form the silicon compound layer 43 is any element that can be used as a dopant material for doping the silicon layer 41. The embodiment will be described with boron as the element that combines with the silicon, merely for convenience. The embodiment is not limited to the element being boron.

In an embodiment the silicon compound layer 43 comprises a silicon boride. Silicon boride has the chemical formula $SiB_x$, where x can be 3, 4, 6, 14, 15, 40 etc. Silicon boride has metallic properties. In particular, the silicon compound layer 43 has the property of metal that it increases the emissivity for EUV radiation of the membrane 40. A membrane made of only the silicon layer 41 would have a low emissivity, perhaps of the order of 3%. The emissivity dramatically increases if a metal or a compound that has metallic properties is added to the membrane 40.

Metals are known to limit the practical thickness of the membrane due to EUV absorption. By providing the silicon membrane layer 43, an embodiment of the invention is expected to achieve an increase in possible thickness of a membrane 40 that has sufficient emissivity for use in the lithographic apparatus 100.

As depicted in FIG. 7, in an embodiment the silicon compound layer 43 is formed as an interlayer between the silicon layer 41 and a non-metallic layer 42 comprising the element that combines with silicon to form the silicon compound layer 43. For example, in an embodiment the non-metallic layer 42 comprises boron. In an embodiment the boron is provided in the form of boron carbide. However alternative forms of boron can be used.

In an embodiment the silicon layer 41 is initially provided adjacent to the non-metallic layer 42. The boron in the non-metallic layer 42 locally dopes the silicon in the silicon layer 41. The boron dopes the silicon to the extent that silicon boride is produced to form the silicon compound layer 43. The boron dopes the silicon such that there are more boron atoms than silicon atoms in the doped silicon, i.e. forming silicon boride.

In an embodiment, silicon layers 41 and non-metallic layers 42 are provided as multilayers. Locally, boron silicide can strengthen the membrane 40 (by a laminate effect and by radiation hardening of boron in silicon) so that the membrane 40 can withstand higher temperatures.

As depicted in FIG. 7, in an embodiment the stack comprises a plurality of silicon layers 41, a plurality of non-metallic layers 42 and a silicon compound layer 43 between each pair of silicon layers 41 and a non-metallic layer 42.

As depicted in FIG. 7, in an embodiment the stack comprises layers in the following order: a non-metallic layer 42, a silicon compound layer 43, a silicon layer 41, a silicon compound layer 43, a non-metallic layer 42, a silicon compound layer 43, a silicon layer 41, a silicon compound layer 43, a non-metallic layer 42, a silicon compound layer 43, a silicon layer 41, a silicon compound layer 43 and a non-metallic layer 42. This is a multilayer stack. In an embodiment the stack may comprise a non-metallic layer 42 and then repeated cycles of a set of four layers comprising a silicon compound layer 43, a silicon layer 41, a silicon compound layer 43 and a non-metallic layer 42.

In an embodiment each non-metallic layer 42 has a thickness of at least 0.5 nm, optionally at least 1 nm and optionally at least 2 nm. In an embodiment each non-metallic layer 42 has a thickness of at most 10 nm, optionally at most 5 nm, and optionally at most 2 nm.

In an embodiment each silicon compound layer 43 has a thickness of at least 0.5 nm, optionally at least 1 nm, and optionally at least 2 nm. In an embodiment each silicon compound layer 43 has a thickness at most 10 nm, optionally at most 5 nm, and optionally at most 2 nm.

In an embodiment each silicon layer 41 has a thickness of at least 2 nm, optionally at least 5 nm, and optionally at least 8 nm. In an embodiment each silicon layer 41 has a thickness of at most 20 nm, optionally at most 10 nm, optionally at most 8 nm.

The embodiment depicted in FIG. 7 with silicon layers 41 of 8 nm thickness, non-metallic layers 42 of 2 nm thickness and silicon compound layers 43 of 2 nm thickness is expected to be achieve an emissivity for EUV radiation of about 90%.

Figure 8:
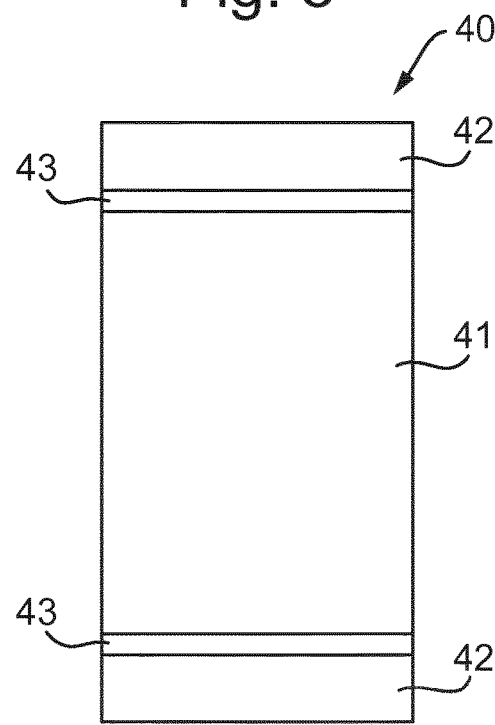

FIG. 8 depicts an alternative embodiment in which the stack comprises layers in the following order: a non-metallic layer 42, a silicon compound layer 43, a silicon layer 41, a silicon compound layer 43 and a non-metallic layer 42.

As depicted in FIG. 8 in an embodiment the membrane 40 comprises only one silicon layer 41. In such an embodiment the silicon layer 41 can have a thickness of at least 10 nm, optionally at least 20 nm, and optionally at least 38 nm. In an embodiment the single silicon layer 41 has a thickness of at most 100 nm, optionally at most 50 nm, and optionally at most 38 nm. The embodiment shown in FIG. 8 and having a silicon layer 41 of 38 nm thickness, non-metallic layer 42 of 4 nm thickness and silicon compound layer 43 of 2 nm thickness is expected to achieve an emissivity for EUV radiation of about 90%.

In an embodiment a total combined thickness of silicon compound layers 43 in the stack is at most about 20 nm. Metal and compounds having metallic properties improve the emissivity of the membrane 40 provided that the combined thickness is not too thick. For layers of metal or compounds having metallic properties that are too thick, the emissivity can be reduced.

Figure 9:
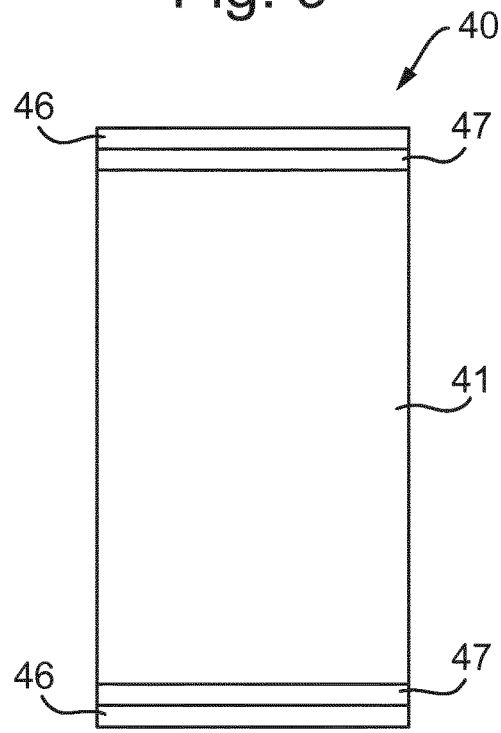

FIG. 9 schematically depicts an alternative embodiment of a membrane 40. As depicted in FIG. 9, in an embodiment the stack comprises at least one silicon layer 41, at least one capping layer 46 and at least one anti-migration layer 47. In an embodiment the capping layer 46 comprises ruthenium. The capping layer 46 is provided at an external surface of the membrane 40. The anti-migration layer 47 comprises at least one of molybdenum and titanium. The anti-migration layer 47 is adjacent to each capping layer 46.

The capping layer 46 comprising ruthenium improves the emissivity of the membrane 40. The capping layer 46 reduces the possibility of the membrane 40 oxidizing. The capping layer 46 is configured to protect the membrane 40 from hydrogen gas.

During use of the lithographic apparatus 100, the membrane 40 can heat up due to absorbing radiation. When the capping layer 46 heats up, the material (e.g. ruthenium) of the capping layer 46 can migrate. The migration is the transport of the material caused by the gradual movement of the ions in the capping layer 46. When the material starts to migrate, the material can form islands in the capping layer 46. When the material starts to migrate, the effectiveness of the capping layer 46 in reducing oxidation, protecting from hydrogen gas and improving emissivity is reduced. Hence, during use of the lithographic apparatus 100, the membrane 40 can start to oxidize and the emissivity can decrease.

By providing the anti-migration layer 47, migration of the capping layer 46 is reduced. Molybdenum and titanium are metals that have relatively high melting temperatures and good emissivity for UV radiation. Titanium and molybdenum do not migrate as much has ruthenium when they are heated. Titanium and molybdenum have good metal to metal contact with ruthenium. By providing the anti-migration layer 47 adjacent to the capping layer 46, migration of the capping layer 46 is reduced. As a result, even when the capping layer 46 is heated during use of the lithographic apparatus 100, the good properties of the capping layer 46 are retained at higher temperatures.

As depicted in FIG. 9, in an embodiment the stack comprises layers in the following order: a capping layer 46 comprising ruthenium at an external surface of the membrane 40, an anti-migration layer 47 comprising at least one of molybdenum and titanium, a silicon layer 41, an anti-migration layer 47 comprising at least one of molybdenum and titanium, and a capping layer 46 comprising ruthenium at the other external surface of the membrane 40. In an embodiment a capping layer 46 comprising ruthenium is provided at both external surfaces of the membrane 40.

Figure 10:
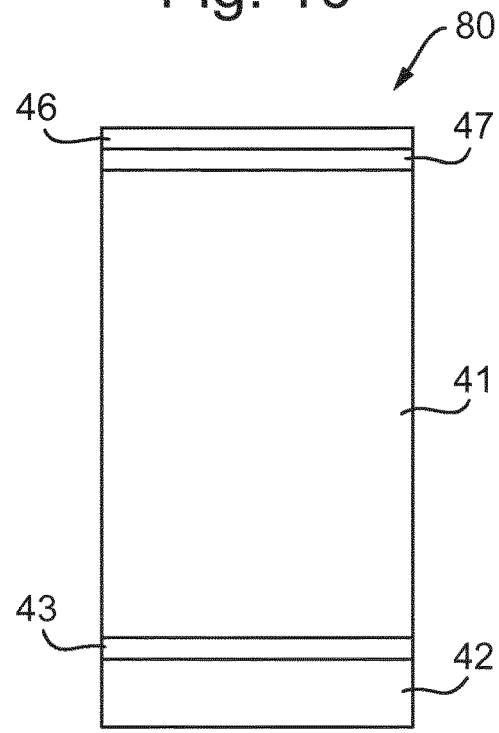

FIG. 10 depicts an alternative embodiment of a membrane in which the use of the anti-migration layer 47 is combined with the idea of using the silicon compound layer 43.

As depicted in FIG. 10 in an embodiment the stack comprises layers in the following order: a capping layer 46 comprising ruthenium at an external surface of the membrane 40, an anti-migration layer 47 comprising at least one of molybdenum and titanium, a silicon layer 41, a silicon compound layer 43 and a non-metallic layer 42.

During manufacture of the membrane assembly 80, the boron carbide layer can protect the silicon layer 41 chemically from etching processes. In an embodiment the membrane 40 comprises a periodic structure. In an embodiment the period is not set to be equal to 6.6 nm or 6.7 nm. If the period is at or close to 6.7 nm the membrane may act as a mirror for the EUV radiation.

Silicon can crystallise in a diamond cubic crystal structure. In an embodiment the border 81 comprises a cubic crystal of silicon. In an embodiment the border 81 has a <100> crystallographic direction.

In an embodiment the silicon layer 41 is formed from polycrystalline or nanocrystalline silicon. Polycrystalline or nanocrystalline silicon has a brittle nature. Hence, a membrane 40 that comprises a silicon layer 41 formed from polycrystalline or nanocrystalline silicon can shatter into many particles when the membrane assembly 80 breaks. An embodiment of the invention is expected to achieve an improvement in the mechanical properties of the membrane assembly 80.

Polycrystalline silicon and nanocrystalline silicon each have high transmission for EUV radiation. Polycrystalline silicon and nanocrystalline silicon each have good mechanical strength.

However, it is not essential for the membrane of the silicon layer 41 to be formed from polycrystalline or nanocrystalline silicon. For example, in an alternative embodiment the silicon layer 41 is formed from a multi-lattice membrane or a silicon nitride.

In a further alternative embodiment the silicon layer 41 is formed from monocrystalline silicon. In such an embodiment the monocrystalline silicon membrane can be formed by a silicon on insulator (SOI) technique. The starting material for this product is a so-called SOI substrate. An SOI substrate is a substrate comprising a silicon carrier substrate with a thin, monocrystalline silicon layer on top of a buried isolating $SiO_2$ layer. In an embodiment the thickness of the monocrystalline silicon layer can range between about 5 nm to about 5 μm. In an embodiment the silicon layer 41 is present on the SOI substrate before the SOI substrate is used in the method of manufacture.

In an embodiment the silicon layer 41 comprises silicon in one of its allotrope forms such as amorphous, monocrystalline, polycrystalline or nanocrystalline silicon. A nanocrystalline silicon means a polycrystalline silicon matrix containing a certain amorphous silicon content. In an embodiment polycrystalline or nanocrystalline silicon is formed by crystallising amorphous silicon in the silicon layer 41. For example, in an embodiment a silicon layer 41 is added to the stack as an amorphous silicon layer. The amorphous silicon layer crystallises into a polycrystalline or nanocrystalline silicon layer when a certain temperature is exceeded. For example, the silicon layer 41 as an amorphous silicon layer transforms into the silicon layer 41 as a polycrystalline or nanocrystalline silicon layer.

In an embodiment the amorphous silicon layer is in-situ doped during its growth. In an embodiment the amorphous silicon layer is doped after its growth. By adding a p- or n-type dopant the silicon conductivity increases, which has a positive effect on the thermomechanical behavior due to the power of the EUV source.

In an embodiment the membrane 40 is thin enough that its transmission for EUV radiation is sufficiently high, for example greater than 50%. In an embodiment the thickness of the membrane 40 is at most about 200 nm, and optionally at most about 150 nm. A 150 nm Si membrane would transmit about 77% of incident EUV radiation. In an embodiment the thickness of the membrane 40 is at most about 100 nm. A 100 nm Si membrane would transmit about 84% of incident EUV radiation. A 60 nm Si membrane would transmit about 90% of incident EUV radiation.

In an embodiment the membrane 40 is thick enough that it is mechanically stable when the membrane assembly 80 is fixed to the patterning device MA of the lithographic apparatus 100 and during use of the lithographic apparatus 100. In an embodiment the thickness of the membrane 40 is at least about 10 nm, optionally at least about 20 nm, and optionally at least about 35 nm. In an embodiment the thickness of the membrane 40 is about 55 nm.

In an embodiment the membrane assembly 80 is applied as a pellicle or as part of a dynamic gas lock. Alternatively, the membrane assembly 80 can be applied in other filtration areas such as identification, or for beam splitters.

Embodiments of the invention are described in the clauses set out below:

1. A membrane assembly for EUV lithography, the membrane assembly comprising:
   a planar membrane;
   a border configured to hold the membrane; and
   a frame assembly connected to the border and configured to releasably attach to a patterning device for EUV lithography, wherein the frame assembly comprises a resilient member;
   wherein the frame assembly is connected to the border in a direction perpendicular to the plane of the membrane such that in use the frame assembly is between the border and the patterning device.

2. The membrane assembly of clause 1, wherein a mounting feature is provided between the border and the patterning device.

3. The membrane assembly of any of clauses 1 and 2, wherein the frame assembly comprises at least one hole configured to receive a protrusion protruding from the patterning device, wherein the hole at least partially overlaps the border when viewed in the direction perpendicular to the plane of the membrane.

4. The membrane assembly of clause 3, wherein the frame assembly comprises a locking mechanism configured to lock the frame assembly to the protrusion.

5. The membrane assembly of clause 4, wherein the locking mechanism comprises a resilient member for each hole, wherein each resilient member extends into the hole and is configured to be deformable when the protrusion received in the hole presses against the resilient member.

6. The membrane assembly of clause 5, wherein the locking mechanism comprises a locking member for each hole, wherein the locking member is configured to be moveable to a locking position where the locking member extends into the hole such that the compressed resilient member exerts a force on the protrusion received in the hole towards the locking member.

7. A patterning device assembly for EUV lithography, the patterning device assembly comprising:
   a planar patterning device;
   at least one protrusion protruding from the patterning device; and
   the membrane assembly of any preceding clause, the frame assembly being connected to the patterning device via the at least one protrusion;
   wherein the at least one protrusion is between the border and the patterning device.

8. A patterning device assembly for EUV lithography, the patterning device assembly comprising:
   a planar patterning device;
   a membrane assembly comprising a planar membrane and a border configured to hold the membrane;
   at least one protrusion protruding from one of the patterning device and the border, wherein the at least one protrusion is between the border and the patterning device; and a frame assembly connected to the other of the patterning device and the border, wherein the frame assembly is configured to attach to the at least one protrusion between the border and the patterning device.

9. A membrane assembly for EUV lithography, the membrane assembly comprising:
   a planar membrane; and
   a frame assembly configured to hold the membrane and to attach to a patterning device for EUV lithography;
   wherein the frame assembly has a locked state in which the frame assembly is locked to the patterning device such that the membrane is held a predetermined distance from the patterning device, and an unlocked state in which the membrane is less than the predetermined distance from the patterning device.

10. The membrane assembly of clause 9, wherein the frame assembly comprises:
    a membrane holder configured to hold the membrane;
    a clamping member; and
    a resilient member connecting the membrane holder to the clamping member;
    wherein the membrane holder is movable relative to the clamping member in a direction perpendicular to the plane of the membrane via compression of the resilient member.

11. The membrane assembly of clause 10, wherein the clamping member comprises an abutment surface configured to contact an engagement surface of a protrusion protruding from the patterning device, wherein the engagement surface faces away from the patterning device.

12. The membrane assembly of clause 10 or 11, wherein the membrane holder comprises an end stop surface configured to contact a locking surface of a protrusion protruding from the patterning device when the frame assembly is in the locked state, wherein the locking surface faces towards the patterning device.

13. The membrane assembly of any of clauses 10 to 12, wherein the resilient member is configured to bias the frame assembly to the locked state.

14. The membrane assembly of any of clauses 10 to 13, wherein the frame assembly is configured such that when the resilient member is compressed, the membrane holder moves towards the patterning device.

15. A patterning device assembly for EUV lithography, the patterning device assembly comprising:
    a planar patterning device for EUV lithography;
    a membrane assembly comprising:
      a planar membrane; and
      a frame assembly configured to hold the membrane and to attach to the patterning device,
    wherein a gap is formed between opposing surfaces of the frame assembly and the patterning device;
    wherein the frame assembly comprises an elongate baffle configured to restrain contaminant particles from entering the gap, wherein the elongate baffle extends beyond the opposing surface of the patterning device at a location beyond the planar extent of the patterning device.

16. A patterning device assembly for EUV lithography, the patterning device assembly comprising:
    a planar patterning device; and
    the membrane assembly of any of clauses 1 to 6 and 9 to 14, wherein a gap is formed between opposing surfaces of the frame assembly and the patterning device to which the frame assembly is attached;
    wherein the frame assembly comprises an elongate baffle configured to restrain contaminant particles from entering the gap, wherein the elongate baffle extends beyond the opposing surface of the patterning device at a location beyond the planar extent of the patterning device.

17. The patterning device assembly of clause 8 or 9, wherein a gap is formed between opposing surfaces of the frame assembly and the patterning device to which the frame assembly is attached;
    wherein the frame assembly comprises an elongate baffle configured to restrain contaminant particles from entering the gap, wherein the elongate baffle extends beyond the opposing surface of the patterning device at a location beyond the planar extent of the patterning device.

18. The patterning device assembly of any of clauses 15 to 17, wherein the frame assembly comprises:
    at least one further baffle configured to restrain contaminant particles from entering the gap, wherein each further baffle extends towards the patterning device.

19. A loading apparatus for temporarily housing a membrane assembly that is mounted onto a patterning device for EUV lithography, the loading apparatus comprising protrusions at an inner surface of the loading apparatus, wherein the protrusions are configured to press a membrane holder of the membrane assembly towards the patterning device when the loading apparatus houses the membrane assembly.

20. A patterning device assembly for EUV lithography, the patterning device assembly comprising:
    a planar patterning device;
    the membrane assembly of any of clauses 9 to 14 mounted onto the patterning device; and
    a loading apparatus for temporarily housing the membrane assembly, the loading apparatus comprising protrusions at an inner surface of the loading apparatus, wherein the protrusions are configured to press the membrane holder of the membrane assembly towards the patterning device when the loading apparatus houses the membrane assembly.

21. The patterning device assembly of clause 20, wherein the membrane assembly comprises a sealing frame positioned around the membrane and configured to control opening of a volume between the membrane and the patterning device.

22. The patterning device assembly of clause 21, wherein the sealing frame comprises a plurality of seal openings, wherein when the membrane holder is pressed towards the patterning device, frame openings in the frame assembly line up with the seal openings to allow a flow of gas through the seal openings and the frame openings.

23. The patterning device assembly of clause 22, wherein the seal openings are arranged such that the seal openings do not line up with the frame openings when the membrane assembly is not housed by the loading apparatus such that the membrane holder is not pressed towards the patterning device.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

While specific embodiments of the invention have been described above, it will be appreciated that the invention may be practiced otherwise than as described. For example, the various photo resist layers may be replaced by non-photo resist layers that perform the same function.

The descriptions above are intended to be illustrative, not limiting. Thus it will be apparent to one skilled in the art that modifications may be made to the invention as described without departing from the scope of the claims set out below.

The invention claimed is:

1. A membrane assembly for EUV lithography, the membrane assembly comprising:
a planar membrane;
a border configured to hold the membrane; and
a frame assembly connected to the border and configured to releasably attach to a patterning device for EUV lithography,
wherein the frame assembly comprises a resilient member, and
wherein the frame assembly is connected to the border in a direction perpendicular to the plane of the membrane such that in use the frame assembly is between the border and the patterning device.

2. The membrane assembly of claim 1, wherein a mounting feature is located between the border and the patterning device.

3. The membrane assembly of claim 1, wherein the frame assembly comprises at least one hole configured to receive a protrusion protruding from the patterning device, wherein the hole at least partially overlaps the border when viewed in the direction perpendicular to the plane of the membrane.

4. The membrane assembly of claim 3, wherein the frame assembly comprises a locking mechanism configured to lock the frame assembly to the protrusion.

5. The membrane assembly of claim 4, wherein the locking mechanism comprises a resilient member for each hole, wherein the resilient member extends into the hole and is configured to be deformable when the protrusion received in the hole presses against the resilient member.

6. The membrane assembly of claim 5, wherein the locking mechanism comprises a locking member for each hole, wherein the locking member is configured to be moveable to a locking position where the locking member extends into the hole such that the compressed resilient member exerts a force on the protrusion received in the hole towards the locking member.

7. A patterning device assembly for EUV lithography, the patterning device assembly comprising:
a planar patterning device;
at least one protrusion protruding from the patterning device; and
the membrane assembly of claim 1, the frame assembly being connected to the patterning device via the at least one protrusion,
wherein the at least one protrusion is between the border and the patterning device.

8. A patterning device assembly for EUV lithography, the patterning device assembly comprising:
a planar patterning device; and
the membrane assembly of claim 1,
wherein a gap is formed between opposing surfaces of the frame assembly and the patterning device to which the frame assembly is attached,
wherein the frame assembly comprises an elongate baffle configured to restrain contaminant particles from entering the gap, and
wherein the elongate baffle extends beyond the opposing surface of the patterning device at a location beyond the planar extent of the patterning device.

9. The patterning device assembly of claim 8, wherein the frame assembly comprises at least one further baffle configured to restrain contaminant particles from entering the gap, wherein each further baffle extends towards the patterning device.

10. A patterning device assembly for EUV lithography, the patterning device assembly comprising:
a planar patterning device;
a membrane assembly comprising a planar membrane and a border configured to hold the membrane;
at least one protrusion protruding from the patterning device or the border, wherein the at least one protrusion is between the border and the patterning device; and
a frame assembly connected to the other of the patterning device or border having the at least one protrusion, wherein the frame assembly is configured to attach to the at least one protrusion between the border and the patterning device.

11. The patterning device assembly of claim 10, wherein a gap is formed between opposing surfaces of the frame assembly and the patterning device to which the frame assembly is attached,
wherein the frame assembly comprises an elongate baffle configured to restrain contaminant particles from entering the gap, and
wherein the elongate baffle extends beyond the opposing surface of the patterning device at a location beyond the planar extent of the patterning device.

12. A membrane assembly for EUV lithography, the membrane assembly comprising:
a planar membrane; and
a frame assembly configured to hold the membrane and to attach to a patterning device for EUV lithography,
wherein the frame assembly has a locked state in which the frame assembly is locked to the patterning device such that the membrane is held a certain distance from the patterning device, and an unlocked state in which the membrane is less than the certain distance from the patterning device.

13. The membrane assembly of claim 12, wherein the frame assembly comprises:
a membrane holder configured to hold the membrane;
a clamping member; and
a resilient member connecting the membrane holder to the clamping member,
wherein the membrane holder is movable relative to the clamping member in a direction perpendicular to a plane of the membrane via compression of the resilient member.

14. The membrane assembly of claim 13, wherein the clamping member comprises an abutment surface configured to contact an engagement surface of a protrusion protruding from the patterning device, wherein the engagement surface faces away from the patterning device.

15. The membrane assembly of claim 13, wherein the membrane holder comprises an end stop surface configured to contact a locking surface of a protrusion protruding from the patterning device when the frame assembly is in the locked state, wherein the locking surface faces towards the patterning device.

16. The membrane assembly of claim 13, wherein the resilient member is configured to bias the frame assembly to the locked state.

17. The membrane assembly of claim 13, wherein the frame assembly is configured such that when the resilient member is compressed, the membrane holder moves towards the patterning device.

18. A patterning device assembly for EUV lithography, the patterning device assembly comprising:
   a planar patterning device;
   the membrane assembly of claim 12 mounted onto the patterning device; and
   a loading apparatus configured to temporarily house the membrane assembly, the loading apparatus comprising protrusions at an inner surface of the loading apparatus, wherein the protrusions are configured to press the membrane holder of the membrane assembly towards the patterning device when the loading apparatus houses the membrane assembly.

19. The patterning device assembly of claim 18, wherein the membrane assembly comprises a sealing frame positioned around the membrane and configured to control opening of a volume between the membrane and the patterning device.

20. The patterning device assembly of claim 19, wherein the sealing frame comprises a plurality of seal openings, wherein when the membrane holder is pressed towards the patterning device, frame openings in the frame assembly line up with the seal openings to allow a flow of gas through the seal openings and the frame openings.

* * * * *

UNITED STATES PATENT AND TRADEMARK OFFICE
CERTIFICATE OF CORRECTION

PATENT NO. : 11,036,128 B2
APPLICATION NO. : 16/060837
DATED : June 15, 2021
INVENTOR(S) : Brouns et al.

Page 1 of 1

It is certified that error appears in the above-identified patent and that said Letters Patent is hereby corrected as shown below:

On the Title Page

Item [30], insert:
-- Mar. 1, 2016 (EP) ......... 16157967
Dec. 14, 2015 (EP) ......... 15199845 --

Signed and Sealed this
Thirty-first Day of August, 2021

Drew Hirshfeld
*Performing the Functions and Duties of the*
*Under Secretary of Commerce for Intellectual Property and*
*Director of the United States Patent and Trademark Office*